US 7,071,526 B2

(12) United States Patent
Ando et al.

(10) Patent No.: US 7,071,526 B2
(45) Date of Patent: Jul. 4, 2006

(54) SEMICONDUCTOR DEVICE HAVING SCHOTTKY JUNCTION ELECTRODE

(75) Inventors: Yuji Ando, Tokyo (JP); Hironobu Miyamoto, Tokyo (JP); Yasuhiro Okamoto, Tokyo (JP); Kensuke Kasahara, Tokyo (JP); Tatsuo Nakayama, Tokyo (JP); Masaaki Kuzuhara, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 10/518,602

(22) PCT Filed: Jun. 17, 2003

(86) PCT No.: PCT/JP03/07676

§ 371 (c)(1),
(2), (4) Date: Mar. 4, 2005

(87) PCT Pub. No.: WO03/107431

PCT Pub. Date: Dec. 24, 2003

(65) Prior Publication Data

US 2005/0151255 A1 Jul. 14, 2005

(30) Foreign Application Priority Data

Jun. 17, 2002 (JP) .............................. 2002-175243

(51) Int. Cl.
*H01L 27/095* (2006.01)
*H01L 29/47* (2006.01)

(52) U.S. Cl. ........................ 257/473; 257/486; 257/485

(58) Field of Classification Search ........ 257/E29.149, 257/280, 485, 486, 476, 615, 471–473
See application file for complete search history.

(56) References Cited

U.S. PATENT DOCUMENTS 4,951,121 A * 8/1990 Furukawa et al. .......... 257/751
6,521,998 B1 * 2/2003 Teraguchi et al. .......... 257/745

(Continued)

FOREIGN PATENT DOCUMENTS

| JP | 11-354817 | 12/1999 |
| JP | 2000-277724 | 10/2000 |
| JP | 2001-156081 | 6/2001 |

OTHER PUBLICATIONS

Kim et al., "High-temperature structural behavior of Ni/Au Contact on GaN(0001)", MRS Internet Journal: Nitride Semiconductor Research, Feb. 15, 2001.*

(Continued)

*Primary Examiner*—Kenneth Parker
*Assistant Examiner*—Matthew C Landau
(74) *Attorney, Agent, or Firm*—Dickstein, Shapiro, Morin & Oshinsky, LLP.

(57) ABSTRACT

A GaN semiconductor device with improved heat resistance of the Schottky junction electrode and excellent power performance and reliability is provided. In this semiconductor device having a Schottky gate electrode 17 which is in contact with an AlGaN electron supplying layer 14, a gate electrode 17 comprises a laminated structure wherein a first metal layer 171 formed of any of Ni, Pt and Pd, a second metal layer 172 formed of any of Mo, Pt, W, Ti, Ta, MoSi, PtSi, WSi, TiSi, TaSi, MoN, WN, TiN and TaN, and a third metal layer formed of any of Au, Cu, Al and Pt. Since the second metal layer comprises a metal material having a high melting point, it works as a barrier to the interdiffusion between the first metal layer and the third metal layer, and the deterioration of the gate characteristics caused by high temperature operation is suppressed. Since the first metal layer contacting the AlGaN electron supplying layer 14 has a high work function, the Schottky barrier is high, and superior Schottky contact is obtained.

50 Claims, 16 Drawing Sheets

U.S. PATENT DOCUMENTS

2003/0107065 A1* 6/2003 Taniguchi et al. .......... 257/289
2003/0109088 A1* 6/2003 Nishii et al. ................ 438/167

OTHER PUBLICATIONS

T. Egawa, et al.; "Recessed gate AlGaN/GaN modulation-doped field-effect transistors on sapphire"; Appl. Phys. Lett., Jan. 3, 2000; vol. 76(1); pp. 121-123.

Egawa, Takashi, et al.; "Characteristics of a GaN Metal Semiconductor Field-Effect Transistor Grown on a Sapphire Substrate by Metalorganic Chemical Vapor Deposition"; Jpn. J. Appl. Phys.; Apr. 1999; vol. 38; Part 1; No. 4B; pp. 2630-2633.

* cited by examiner

SEMICONDUCTOR DEVICE HAVING SCHOTTKY JUNCTION ELECTRODE

CROSS-REFERENCE TO RELATED APPLICATIONS

This application is a filing under 35 U.S.C 371 of International Application No. PCT/JP03/07676, filed on Jun. 17, 2003, and published in the Japanese language. That international application claimed priority to Japanese Application No. 2002-175243, filed Jun. 17, 2002.

TECHNICAL FIELD

The present invention relates to a high output semiconductor device used in a microwave band comprising GaN as the principal material. Particularly, the present invention relates to a Schottky junction electrode used for a semiconductor device superior in heat resistance and power performance.

In order to more sufficiently describe the current level of technology pertaining to the present invention, all descriptions of the patents, the patent applications, the patent publications, the treatises on science or the like that are cited or specified in the present patent application are incorporated hereinto through reference.

BACKGROUND OF THE ART

FIG. 1 is a local longitudinal sectional view of a semiconductor device having a conventional Schottky junction electrode. The semiconductor device is reported, for example, in the Reference, IEEE Trans. Microwave Theory Tech. (Vol. No. 46, No. 6, Page 756, 1998) authored by U. K. Mishra et al.

As shown in FIG. 1, the semiconductor device is a heterojunction field-effect transistor which has a multilayered structure of a plurality of nitride compound semiconductor layers formed on a sapphire substrate. Specifically, a buffer layer 62 comprising aluminum nitride (AlN), a gallium nitride (GaN) channel layer 63, and an aluminum gallium nitride (AlGaN) doped layer 64 are sequentially formed on the sapphire substrate 61, and the laminated body of the nitride compound semiconductors is thus configured on the sapphire substrate 61.

In addition, a source electrode 6S and a drain electrode 6D are formed in contact with the AlGaN electron supplying layer 64, and these source electrode 6S and the drain electrode 6D are in ohmic contact with the AlGaN electron supplying layer 64.

Furthermore, the source electrode 6S and the drain electrode 6D are spaced out, a gate electrode 67 is formed in contact with the AlGaN electron supplying layer 64, and this gate electrode 67 is in Schottky contact with the AlGaN electron supplying layer 64. In other words, the gate electrode 67 is a Schottky gate electrode. The gate electrode 67, herein, comprises a two-layer laminated structure: a Ni layer 671 in contact with the AlGaN electron supplying layer 64, and an Au layer in contact with the Ni layer 671. In the Schottky interface of GaN semiconductors which comprise GaN, AlGaN or the like, since the influence of Fermi level by pinning is small, the barrier height (f B) is determined by the difference between the work function (Wm) of a metal and the electron affinity (?s) of a semiconductor.

$$fB = Wm - ?s \qquad (1)$$

Therefore, the Schottky junction electrode 67 of a semiconductor device by a prior art was in contact with the AlGaN layer 64, and comprised a metal layer 671 comprising metals of high work function, for example, Ni, Pt, Pd or the like. In addition, the Au layer 672 is formed on the metal layer 671 to reduce the resistance of the electrode. If the Schottky junction electrode 67 comprises Ni, Pt and Pd, even though a high Schottky barrier can be obtained, a problem exists in that the barrier is thermally unstable, such as the transposition point of Ni being low, approximately 353° C., for example. With a semiconductor device using GaN as the principal material, operation at a high power density (1 to 10 W/mm) is possible because high current density (up to 1A/mm) and high dielectric strength (up to 100V) can be obtained. Under such operating conditions, since the temperature in the vicinity of the gate electrode rises to over 400° C. accompanied by self-heating, the thermal diffusions of Ni, Pt and Pd which are in Schottky contact with the GaN semiconductor and the alloying reaction between Au which constitutes the metal layer 672 and Ni, Pt and Pd were significant.

In order to confirm these phenomena, heat treatment was performed for 15 minutes on the conventional semiconductor device shown in FIG. 1. FIG. 2 is a diagram showing the reverse directional gate current-voltage characteristics measured before and after heat treatment was performed on the semiconductor device shown in FIG. 1. In FIG. 2, the vertical axis indicates the gate current (A/mm) and the horizontal axis indicates the gate-drain voltage (V). According to FIG. 2, it was confirmed that the reserve directional gate current to the gate-drain voltage was increased by about a single digit by performing heat treatment on the conventional semiconductor device shown in FIG. 1.

Moreover, the distribution of the constituent elements in depth direction before and after heat treatment of the conventional semiconductor device shown in FIG. 1 was examined by using Auger spectroscopy. FIG. 3 is a diagram showing the Auger profile before heat treatment of the conventional semiconductor device shown in FIG. 1. FIG. 4 is a diagram showing the Auger profile after heat treatment of the conventional semiconductor device shown in FIG. 1. In FIG. 3 and FIG. 4, the vertical axis indicates the Auger strength (a. u.) and the horizontal axis indicates the sputtering time (minute). By comparing FIG. 3 with FIG. 4, it was confirmed that the interdiffusion of Ni and Au was generated by performing heat treatment at 500° C. on the conventional semiconductor device shown FIG. 1. Therefore, the increase of reverse directional gate current by the heat treatment, as shown in FIG. 2, is considered to be due to the deterioration of the Schottky barrier at the interface with the AlGaN electron supplying layer 64 because the interdiffusion of Ni and Au occurred, as shown in FIG. 3 and FIG. 4, thereby promoting the alloying of Ni and Au, and the work function of the NiAu alloy was smaller than that of Ni. Additionally, there was a problem in that, at high temperatures, thermal diffusion of Ni comprising the Schottky junction electrode 671 to the AlGaN electron supplying layer 64 occurs, forming a deep level, and thereby, destabilizing element characteristics.

DISCLOSURE OF THE INVENTION

The present invention has been created in light of the afore-mentioned problems of the prior art. Therefore, the purpose of the present invention is to improve the heat resistance of the Schottky junction electrode and to provide a semiconductor device using GaN, which has excellent power performance and reliability, as principal material. The first aspect of the present invention is a semiconductor device containing a semiconductor layer comprising a compound semiconductor, which uses $Ga_vAl_{1-v}$ (where, $0 \leq v \leq 1$) as the main constituent of the Group III-element and N as the main constituent of the Group V-elements, and a Schottky junction metal layer which is in contact with the semiconductor layer. In this semiconductor device, the Schottky junction metal layer comprises a laminated structure containing a first metal layer contacting the semiconductor layer, a second metal layer contacting the first metal layer and a third metal layer contacting the second metal layer. The second metal layer comprises a metal material of higher melting point than those of the first metal layer and the third metal layer, and the third metal layer comprises a metal material of lower resistivity than those of the first metal layer and the second metal layer.

The first metal layer may comprise any metal material selected from a group comprising Ni, Pt, Pd, $Ni_zSi_{1-z}$, $Pt_zSi_{1-z}$, $Pd_zSi_{1-z}$, $Ni_zN_{1-z}$, and $Pd_zN_{1-z}$ (where, $0<z<1$), and the second metal layer may comprise any metal material selected from a group comprising Mo, Pt, W, Ti, Ta, $Mo_xSi_{1-x}$, $PtxSi_{1-x}$, $W_xSi_{1-x}$, $Ti_xSi_{1-x}$, $Ta_xSi_{1-x}$, $Mo_xN_{1-x}$, $W_xN_{1-x}$, $Ti_xN_{1-x}$, and $Ta_xN_{1-x}$ (where, $0<x<1$). Furthermore, the third metal layer may comprise any metal material selected from a group comprising Au, Cu, Al and Pt.

Preferably, the first metal layer may comprise any metal material selected from a group comprising $Ni_{z1}Si_{1-z1}$ (where, $0.4 \leq z1 \leq 0.75$), $Pt_{z2}Si_{1-z2}$ (where, $0.5 \leq z2 \leq 0.75$), $Pd_{z3}Si_{1-z3}$ (where, $0.5 \leq z3 \leq 0.85$), $Ni_{z4}N_{1-z4}$ (where, $0.5 \leq z4 \leq 0.85$), and $Pd_{z5}N_{1-z5}$ (where, $0.5 \leq z5 \leq 0.85$). The second metal layer may comprise any metal material selected from a group comprising Mo, Pt, W, Ti, Ta, $Mo_xSi_{1-x}$, $PtxSi_{1-x}$, $W_xSi_{1-x}$, $Ti_xSi_{1-x}$, $Ta_xSi_{1-x}$, $Mo_xN_{1-x}$, $W_xN_{1-x}$, $Ti_xN_{1-x}$, and $Ta_xN_{1-x}$ (where, $0<x<1$). Furthermore, the third metal layer may comprise any metal material selected from a group comprising Au, Cu, Al and Pt.

The first metal layer can comprise a metal material of larger work function than that of the second metal layer. Also, the first metal layer can comprise a metal material of larger work function than that of the third metal material, in addition to that of the second metal layer.

The melting point of the second metal layer is preferably 1,000° C. or higher and more preferably 1,500° C. or higher.

The semiconductor layer may be formed on a multi-layered structure comprising a plurality of compound semiconductor layers formed on a substrate.

The substrate can comprise any substrate selected from a group comprising a sapphire substrate, a SiC substrate and a GaN substrate.

The semiconductor layer can comprise $Al_uGa_{1-u}N$ layer (where, $0 \leq u \leq 1$).

The semiconductor layer can comprise a GaN compound semiconductor electron supplying layer formed on a GaN compound semiconductor channel layer.

The GaN compound semiconductor channel layer can comprise a compound semiconductor selected from a group comprising GaN and InGaN, and the GaN compound semiconductor electron supplying layer can comprise AlGaN.

The semiconductor layer can comprise a GaN compound semiconductor channel layer formed on a GaN compound semiconductor electron supplying layer.

The GaN compound semiconductor channel layer can comprise a compound semiconductor selected from a group comprising GaN and InGaN, and the GaN compound semiconductor electron supplying layer can comprise AlGaN.

The semiconductor layer can comprise an n-type GaN channel layer.

The second aspect of the present invention is a semiconductor device containing a semiconductor layer comprising a compound semiconductor using $Ga_vAl_{1-v}$ (where, $0 \leq v \leq 1$) as the main components of the Group III-elements and N as the main component of the Group V-elements, and a Schottky junction metal layer which is in contact with the semiconductor layer. In this semiconductor device, the Schottky junction metal layer comprises a laminated structure containing a first metal layer contacting the semiconductor layer and a second metal layer contacting the first metal layer. The first metal layer comprises a metal material of a higher melting point than that of the second metal layer, and the second metal layer comprises a metal material of lower resistivity than that of the first metal layer.

The first metal layer can comprise any metal material selected from a group comprising $Ni_ySi_{1-y}$, $Pt_ySi_{1-y}$, $Pd_ySi_{1-y}$, $Ni_yN_{1-y}$, and $Pd_yN_{1-y}$ (where, $0<y<1$). Furthermore, the second metal layer can comprise any metal material selected from a group comprising Au, Cu, Al, and Pt.

More preferably, the first metal layer may comprise any metal material selected from a group comprising $Ni_{y1}Si_{1-y1}$ (where, $0.4 \leq y1 \leq 0.75$), $Pt_{y2}Si_{1-y2}$ (where, $0.5 \leq y2 \leq 70.5$), $Pd_{y3}Si_{1-y3}$ (where, $0.5 \leq y3 \leq 0.85$), $Ni_{y4}N_{1-y4}$ (where, $0.5 \leq y4 \leq 0.85$), and $Pd_{y5}N_{1-y5}$ (where, $0.5 \leq y5 \leq 0.85$). Furthermore, the second metal layer may comprise any metal material selected from a group comprising Au, Cu, Al and Pt.

The first metal layer can comprise a metal material of larger work function than that of the second metal layer.

The melting point of the first metal layer is preferably 1,000° C. or higher and more preferably 1,500° C. or higher.

The semiconductor layer can be formed on a multi-layered structure comprising a plurality of compound semiconductor layers formed on a substrate.

The substrate can comprise any substrate selected from a group comprising a sapphire substrate, a SiC substrate and a GaN substrate.

The semiconductor layer can comprise $Al_uGa_{1-u}$ layer (where, $0 \leq u \leq 1$).

The semiconductor layer can comprise a GaN compound semiconductor electron supplying layer formed on a GaN compound semiconductor channel layer.

The GaN compound semiconductor channel layer can comprise a compound semiconductor selected from a group comprising GaN and InGaN, and the GaN compound semiconductor electron supplying layer can comprise AlGaN.

The semiconductor layer can comprise a GaN compound semiconductor channel layer formed on a GaN compound semiconductor electron supplying layer.

The GaN compound semiconductor channel layer can comprise a compound semiconductor selected from a group comprising GaN and InGaN, and the GaN compound semiconductor electron supplying layer can comprise AlGaN.

The semiconductor layer can comprise an n-type GaN channel layer.

The third aspect of the present invention is a semiconductor device containing a semiconductor layer comprising a compound semiconductor using $Ga_vAl_{1-v}$ (where, $0 \leq v \leq 1$) as the main components of the Group III-elements and N as the main component of the Group V-elements, and a Schottky junction electrode which is in contact with the semiconductor layer. In this semiconductor device, the Schottky junction electrode comprises a laminated structure containing a first metal layer contacting the semiconductor layer and a second metal layer contacting the first metal layer and the third metal layer contacting the second metal layer. The first metal layer comprises any metal material selected from a group comprising Ni, Pt, Pd, $Ni_zSi_{1-z}$, $Pt_zSi_{1-z}$, $Pd_zSi_{1-z}$, $Ni_zN_{1-z}$, and $Pd_zN_{1-z}$ (where, 0<z<1), and the second metal layer comprises any metal material selected from a group comprising Mo, Pt, W, Ti, Ta, $Mo_xSi_{1-x}$, $PtxSi_{1-x}$, $W_xSi_{1-x}$, $Ti_xSi_{1-x}$, $Ta_xSi_{1-x}$, $Mo_xN_{1-x}$, $W_xN_{1-x}$, $Ti_xN_{1-x}$, and $Ta_xN_{1-x}$ (where, 0<x<1), and the third metal layer comprises any metal material selected from a group comprising Au, Cu, Al and Pt.

The fourth aspect of the present invention is a semiconductor device containing a semiconductor layer comprising a compound semiconductor using $Ga_vAl_{1-v}$ (where, $0 \leq v \leq 1$) as the main components of the Group III-elements and N as the main component of the Group V-elements, and a Schottky junction electrode which is in contact with the semiconductor layer. In this semiconductor device, the Schottky junction electrode comprises a laminated structure containing a first metal layer contacting the semiconductor layer and a second metal layer contacting the first metal layer. The first metal layer comprises any metal material selected from a group comprising $Ni_ySi_{1-y}$, $Pt_ySi_{1-y}$, $Pd_ySi_{1-y}$, $Ni_yN_{1-y}$, and $Pd_yN_{1-y}$ (where, 0<y<1), and the second metal layer comprises any metal material selected from a group comprising Au, Cu, Al and Pt.

The fifth aspect of the present invention is a semiconductor device containing a semiconductor layer comprising the compound semiconductor using $Ga_vAl_{1-v}$ (where, $0 \leq v \leq 1$) as the main components of the Group III-elements and N as the main component of the Group V-elements, and a Schottky junction electrode which is in contact with the semiconductor layer. In this semiconductor device, the Schottky junction electrode comprises a laminated structure containing a first metal layer contacting the semiconductor layer, a second metal layer contacting the first metal layer, and a third metal layer contacting the second metal layer. The first metal layer comprises any metal material selected from a group comprising $Ni_{z1}Si_{1-z1}$ (where, $0.4 \leq z1 \leq 0.75$), $Pt_{z2}Si_{1-z2}$ (where, $0.5 \leq z2 \leq 0.75$), $Pd_{z3}Si_{1-z3}$ (where, $0.5 \leq z3 \leq 0.85$), $Ni_{z4}N_{1-z4}$ (where $0.5 \leq z4 \leq 0.85$), and $Pd_{z5}N_{1-z5}$ (where, $0.5 \leq z5 \leq 0.85$), the second metal layer comprises any metal material selected from a group comprising Mo, Pt, W, Ti, Ta, $Mo_xSi_{1-x}$, $Pt_xSi_{1-x}$, $W_xSi_{1-x}$, $Ti_xSi_{1-x}$, $Ta_xSi_{1-x}$, $Mo_xN_{1-x}$, $W_xN_{1-x}$, $Ti_xN_{1-x}$, and $Ta_xN_{1-x}$, and the third metal layer comprises any metal material selected from a group comprising Au, Cu, Al and Pt.

The sixth aspect of the present invention is a semiconductor device containing a semiconductor layer comprising a compound semiconductor using $Ga_vAl_{1-v}$ (where, $0 \leq v \leq 1$) as the main components of the Group III-elements and N as the main component of the Group V-elements, and a Schottky junction electrode which is in contact with the semiconductor layer. In this semiconductor device, the Schottky junction electrode comprises a laminated structure containing a first metal layer contacting the semiconductor layer and a second metal layer contacting the first metal layer. The first metal layer comprises any metal material selected from a group comprising $Ni_{y1}Si_{1-y1}$ (where, $0.4 \leq y1 \leq 0.75$), $Pt_{y2}Si_{1-y2}$ (where, $0.5 \leq y2 \leq 70.5$), $Pd_{y3}Si_{1-y3}$ (where, $0.5 \leq y3 \leq 0.85$), $Ni_{y4}N_{1-y4}$ (where, $0.5 \leq y4 \leq 0.85$), and $Pd_{y5}N_{1-y5}$ (where, $0.5 \leq y5 \leq 0.85$), and the second metal layer comprises any metal material selected from a group comprising Au, Cu, Al and Pt.

BEST MODES FOR CARRYING OUT THE INVENTION

Described below are the embodiments of the present invention according to the forms of embodiments in reference to the drawings.

FIRST EMBODIMENT

Figure 5:
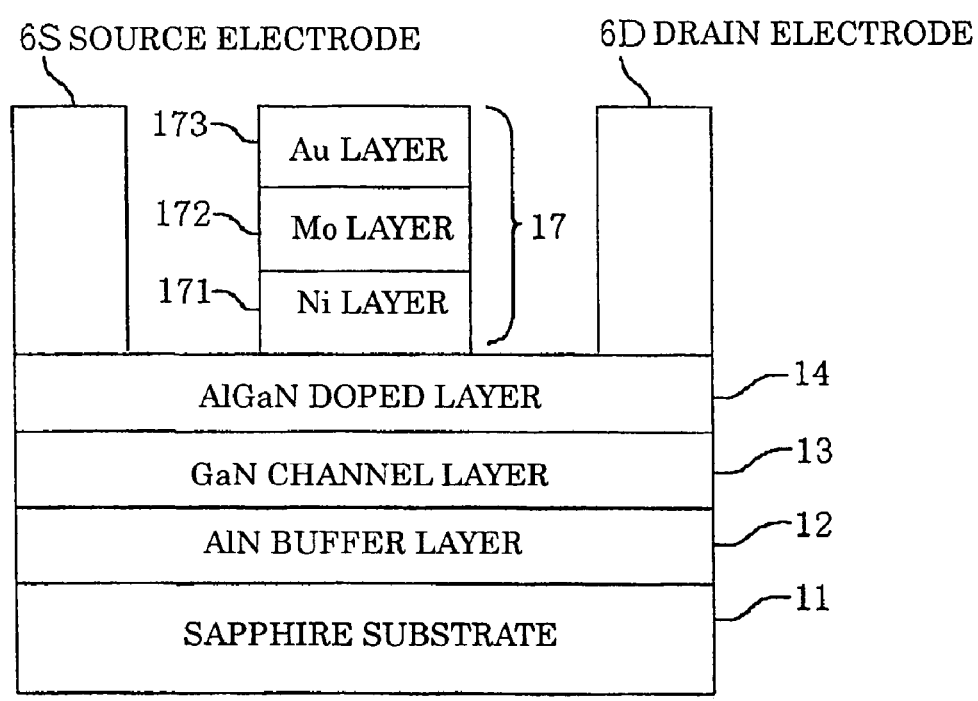
FIG. 5 is a local longitudinal sectional view showing the main structure of an AlGaN/GaN heterojunction field-effect transistor in a first embodiment according to the present invention.
Figure 6:
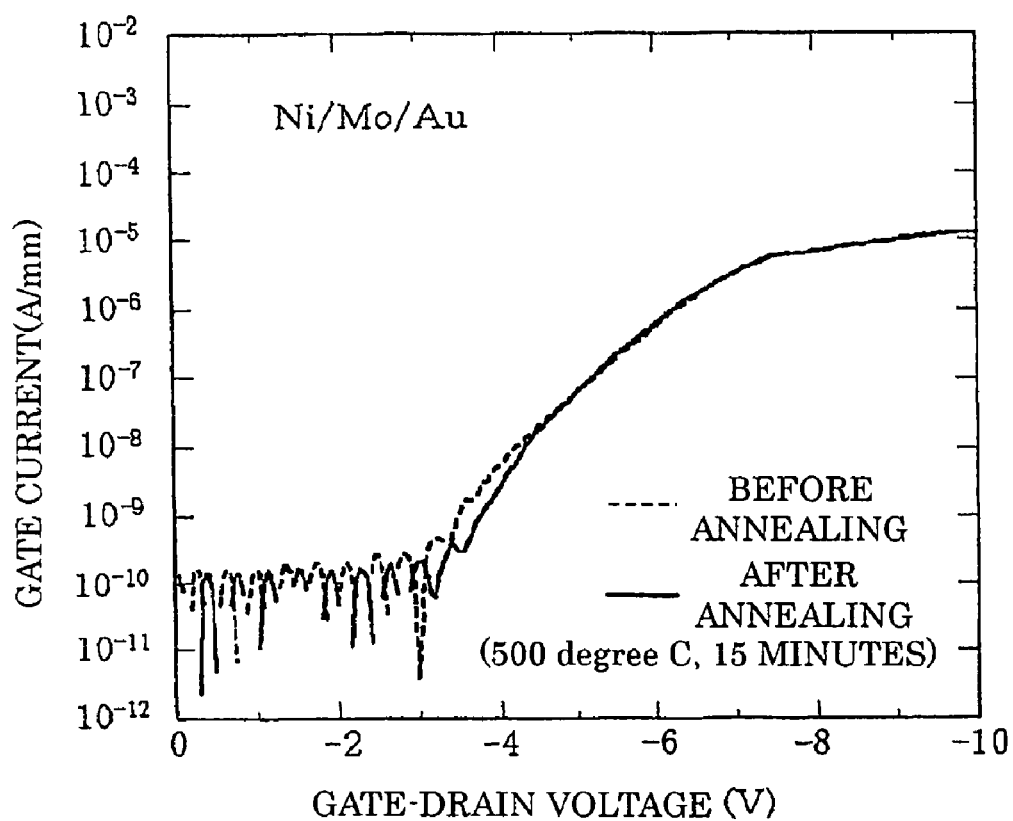
FIG. 6 is a diagram showing the main structure of the reverse directional gate-voltage characteristics before and after heat treatment is performed on the semiconductor device in the first embodiment according to the present invention.
Figure 7:
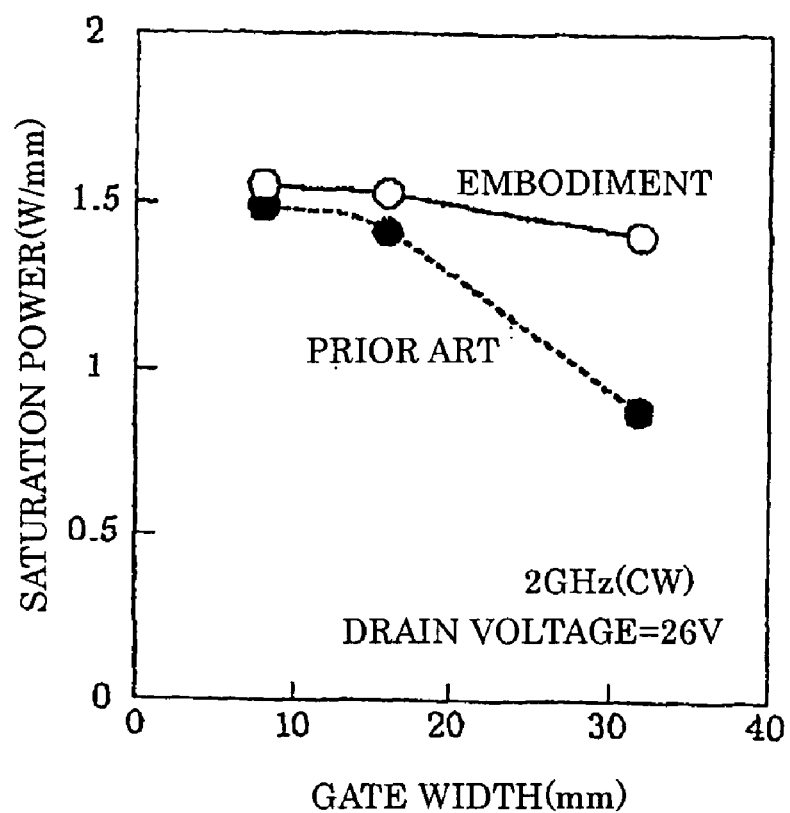
FIG. 7 is a characteristic diagram showing the gate width dependency of the saturated output density of both the conventional semiconductor and the semiconductor in the first embodiment according to the present invention.

Described is a first embodiment according to the present invention in reference to FIG. 5, FIG. 6, and FIG. 7.

FIG. 5 is a local longitudinal sectional view showing the main structure of an AlGaN/GaN heterojunction field-effect transistor (HJFET) in the first embodiment according to the present invention. The transistor is formed on a sapphire substrate 11. In FIG. 5, an undoped AlN buffer layer 12 is formed on the sapphire substrate 11. An undoped GaN channel layer 13 is formed on the undoped AlN buffer layer 12. An undoped AlGaN electron supplying layer 14 is formed on the undoped GaN channel layer 13. Furthermore, a source electrode 6S and a drain electrode 6D are formed in contact with the upper surface of the AlGaN electron supplying layer 14. The source electrode 6s and the drain electrode 6D are in ohmic contact with the AlGaN electron supplying layer 14.

Furthermore, a gate electrode 17 is formed in contact with the upper surface of the AlGaN electron supplying layer 14. The gate electrode 17 is spaced between the source electrode 6S and the drain electrode 6D. The gate electrode 17 is in Schottky contact with the AlGaN electron supplying layer 14. The gate electrode 17 has a three-layer structure. More specifically, the three-layer structure comprises a Ni layer 171 contacting the upper surface of the AlGaN electron supplying layer 14, a Mo layer 172 contacting the upper surface of the Ni layer 171, and an Au layer 173 contacting the upper surface of the Mo layer. The Ni layer is in Schottky contact with the AlGaN electron supplying layer 14.

In addition, accompanying the piezo polarization effect and spontaneous polarization effect attributable to the difference in grating constant between GaN and AlGaN, a two-dimensional electron gas is formed in the area within the GaN channel layer 13 in the vicinity of the interface with the AlGaN electron supplying layer 14. The heterojunction field-effect transistor (HJFET) operates as a transistor by modulating the two-dimensional electron gas concentration with the potential of the gate electrode 17. The semiconductor according to this embodiment can be prepared in the following manner. The afore-mentioned undoped AlN buffer layer 12 with a film thickness of 20 nm, the undoped GaN channel layer 13 with a film thickness of 2 μm, and the undoped $Al_{0.3}Ga_{0.7}N$ electron supplying layer 14 with a film thickness of 30 nm are sequentially grown on the sapphire substrate 11 which has a (0001) surface by, for example, the molecular beam epitaxy (MBE) process.

Here, although the grating constants of AlGaN and GaN differ, the film thickness of 30 nm of the undoped $Al_{0.3}Ga_{0.7}N$ electron supplying layer 14 is less than the critical film thickness at the time of transposition.

Next, the source electrode 6S and the drain electrode 6D are each formed on the AlGaN electron supplying layer 14, for example, by performing vapor deposition or alloy processing on metals such as Ti/Al, and these source electrode 6S and drain electrode 6D are in ohmical contact with the AlGaN electron supplying layer 14. Finally, metal layers are sequentially formed on the AlGaN electron supplying layer 14 in the sequence and with the thicknesses stated below, for example, by vapor deposition/lift-off process to form the Schottky gate electrode 17. A first metal layer 171 comprising Ni of a thickness of 15 nm is formed on the AlGaN electron supplying layer 14; a second metal layer 172 comprising Mo of a thickness of 15 nm is formed on the first metal layer 171; a the third metal layer 173 comprising Au of thickness of 200 nm is formed on the second metal layer. The semiconductor device shown in FIG. 5 can thus be prepared.

The important point in this embodiment lies in the fact that the Schottky gate electrode 17 comprises a three-layer structure wherein the first metal layer 171 comprises Ni which is a metal having a high work function, the second metal layer 172 comprises Mo which is a metal having a high melting point, and the third metal layer 173 comprises Au which is a metal having a low resistivity. More specifically, in order to form a high Schottky barrier at the interface between the semiconductor and the Schottky gate electrode 17, the first metal layer 171 comprises a metal having a high work function. On the other hand, in order to reduce the resistance of the Schottky gate electrode 17, the third metal layer 173 comprises a metal having a low resistivity. Furthermore, in order to prevent interdiffusion at high temperatures between the first metal layer 171 and the third mental layer 173, the second metal layer 172 comprising a metal having a high melting point is interposed between the first metal layer 171 and the third metal layer 173, thereby making possible the enhancement of high temperature characteristics and high power performance of the semiconductor device through enabling the Schottky gate electrode 17 to have a high Schottky barrier, low resistivity and high heat resistance.

More specifically, even when comparing Mo which is the metal material of the second metal layer 172 with Ni which is the metal material of the first metal layer 171 and Au which is the metal material of the third metal layer 173, since Mo has the high melting point of approximately 2,630° C., it functions as a barrier layer to the interdiffusion of Ni and Au. In other words, since the second metal layer 172 which is interposed between the first metal layer 171 and the third metal layer 173 has a higher melting point than those of the first metal layer 171 and the third metal layer 173, even if the temperature of the Schottky gate electrode 17 rises to a high degree, the interdiffusion between the metal in the first metal layer 171 and that in the third metal layer 173 is suppressed, thereby suppressing the alloying between the metals. Although the first metal layer 171 comprises metal of a high work function, the deterioration of the Schottky barrier at the interface between the AlGaN electron supplying layer 14 and the first metal layer 171 and the increase of reverse directional gate current can be suppressed even at high temperatures by suppressing the alloying, as stated above. Therefore, the gate leak current is suppressed even at high temperatures, the heat resistance of the Schottky gate electrode 17 is improved, and as a result, the reliability of the device is improved. In addition, the first metal layer 171 contacting the AlGaN electron supplying layer 14 comprises Ni, and since the work function of Ni is large, approximately 4.6 eV, the Schottky barrier is high, and an excellent Schottky contact can be obtained. Furthermore, the third metal layer 173 comprises Au, and the resistivity of Au is low. Therefore, the high temperature characteristics and high power performance of the semiconductor device can be improved by enabling the Schottky gate electrode 17 to have not only a high Schottky barrier and low resistance, but also high heat resistance. In order to verify the foregoing, heat treatment was performed on the semiconductor device in this embodiment at a temperature of 500° C. for 15 minutes.

Furthermore, the reverse directional gate current-voltage characteristics before and after heat treatment was performed on the semiconductor device was measured. FIG. 6 is a diagram showing the reverse directional gate current-voltage characteristics before and after heat treatment of the semiconductor device in the first embodiment according to the present invention. In FIG. 6, the vertical axis indicates the gate current (A/mm) and the horizontal axis indicates the gate drain voltage (V). The broken line shows the reverse directional gate current-voltage characteristics before heat treatment, and the continuous line shows the reverse directional gate current-voltage characteristics after heat treatment. Almost no change could be observed in the reverse directional gate current before the treatment and after the treatment; that is, the effect of the improved heat resistance in the Schottky gate electrode 17 was confirmed by inserting the Mo layer, which has a high meting point, between the Ni layer and the Au layer.

FIG. 7 is a characteristic diagram showing the gate width dependency of the saturated output density of both the conventional semiconductor device and the semiconductor device in the first embodiment according to the present invention. In FIG. 7, the vertical axis indicates the saturated power (W/mm) and the horizontal axis indicates the gate width of the semiconductor device (mm). The broken line shows the gate width dependency of the saturated output density of the semiconductor device in the prior art, and the continuous line shows that of the semiconductor device in those embodiment. In the prior art, in a large device with a gate width of 32 mm or longer, it was observed that the saturated output density caused by self-heating dropped significantly. On the other hand, in this embodiment, it was confirmed that the decrease in output density accompanied by an increase in gate width was small, and power performance was enhanced by the improved heat resistance in the Schottky gate electrode.

In the embodiment according to the present invention, even though Mo was given as one typical example of a metal element having a high melting point which comprises the second metal layer 172, the foregoing effect can be obtained even if Mo is replaced with, for example, another metal element having a high melting point. Other typical examples of metal elements having a high melting point which comprise the second metal layer 172 include Pt, W, Ti and Ta, but are not necessarily limited to these elements. More specifically, the second metal layer 172 comprising Mo can be replaced with any of a Pt layer, a W layer, a Ti layer and a Ta layer.

The same effect as that in the foregoing can be obtained even if the afore-mentioned metal elements having a high melting point are replaced with intermetallic compounds such as metal silicates and metal nitrides which are thermally stable and have a high melting point as the metal materials which comprise the second metal layer. For example, as the metal materials which comprise the second metal layer 172, the metal layer can be replaced with any of $Mo_xSi_{1-x}$ layer (where, $0<x<1$), $Pt_xSi_{1-x}$ layer (where, $0<x<1$), $W_xSi_{1-x}$ layer (where, $0<x<1$), $Ti_xSi_{1-x}$ layer (where, $0<x<1$), $Ta_xSi_{1-x}$ layer (where, $0<x<1$), $Mo_xN_{1-x}$ layer (where, $0<x<1$), $W_xN_{1-x}$ (where, $0<x<1$), $Ti_xN_{1-x}$ layer (where, $0<x<1$), and $Ta_xN_{1-x}$ layer (where, $0<x<1$). If the melting point of the metal element or the intermetallic compound such as metal silicate and metal nitride comprising the second metal layer 172 is 1,000° C. or higher, the afore-mentioned effect can be obtained. Moreover, it is more preferable that the melting point is 1,500° C. or higher.

Furthermore, in this embodiment according to the present invention, although Ni is given as one typical example of a metal element having a high work function which comprises the first metal layer 171, the foregoing effect can be obtained even if Ni is replaced with, for example, another metal element having a high working function. Other typical examples of metal elements having a high work function which comprise the metal layer 171 include Pt and Pd, but are not necessarily limited to these elements. More specifically, the first metal layer 171 comprising Ni can be replaced with any of a Pt layer and a Pd layer.

Additionally, in this embodiment according to the present invention, although Au is given as one typical example of a metal element having a low resistivity which comprises the third metal layer 173, the foregoing effect can be obtained even if Au is replaced with, for example, another metal element having a low resistivity. Other typical examples of metal elements having a low resistivity which comprise the third metal layer 173 include Cu, Al and Pt, but are not necessarily limited to these elements. More specifically, the third metal layer 173 comprising Au can be replaced with any of a Cu layer, an Al layer and a Pt layer. Moreover, since the third metal layer 173 is a layer provided to reduce the resistance of the Schottky gate electrode as stated above, limitations to the material and the like are unnecessary as long as the layer complies with the purpose.

Furthermore, in the embodiment according to the present invention, although the semiconductor layer with which the Schottky junction electrode is in contact comprises the AlGaN layer, the same effect as that in the foregoing can be obtained even if the afore-mentioned structure is applied to the Schottky junction electrode which is in Schottky contact with the GaN layer, the InAlN layer, the InGaN layer, the InAlGaN layer and the AlN layer. In addition, the same effect as that in the foregoing can be obtained even if the afore-mentioned structure is applied to the Schottky junction electrode which is in Schottky contact with a superlattice layer comprising at least one layer out of the GaN layer, the AlGaN layer, the InAlN layer, the InGaN layer, the InAlGaN layer and the AlN layer. More specifically, the same effect as that in the foregoing can be obtained even if the afore-mentioned structure is applied to the Schottky junction electrode which is in Schottky contact with the semiconductor layer comprising a compound semiconductor using $Ga_vAl_{1-v}$ (where, $0 \leq v \leq 1$) as the main component of the Group III-elements and N as the main component of the Group V-element.

Furthermore, although the embodiments according to the present invention are described by giving a semiconductor device having a planar structure wherein the source electrode, the gate electrode and the drain electrode are formed on the same semiconductor layer as an example, the same effect as that in the foregoing can be obtained even if the afore-mentioned structure is applied to the Schottky junction electrode on a semiconductor device having other Group III-nitride structures. As typical examples of structures other than the planar structure, it may be a recess structure wherein a cap layer selectively comprising an N-type semiconductor is formed under the source electrode and the drain electrode, or an embedded gate structure wherein the gate electrode is embedded in the semiconductor layer such as GaN and AlGaN.

SECOND EMBODIMENT

Figure 8:
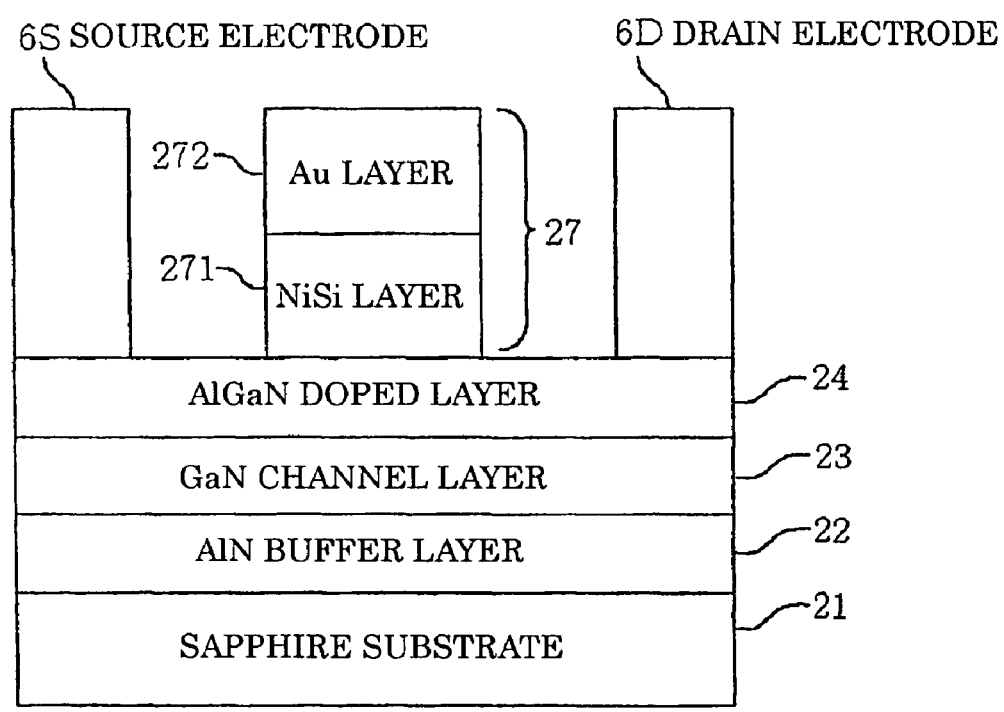
FIG. 8 is a local longitudinal sectional view showing the main structure of the AlGaN/GaN heterojunction field-effect transistor in a second embodiment according to the present invention.

Next, a second embodiment according to the present invention is described in reference to FIG. 8.

FIG. 8 is a local vertical view showing the main structure of an AlGaN/GaN heterojunction field-effect transistor (HJFET) in the second embodiment according to the present invention. The transistor is formed on a sapphire substrate 21. In FIG. 8, an undoped AlN buffer layer 22 with a film thickness of 20 nm is formed on the sapphire substrate 21, an undoped GaN channel layer 23 with a film thickness of 2 µm is formed on the AlN buffer layer 22, and an AlGaN electron supplying layer 24 comprising undoped $Al_{0.3}Ga_{0.7}N$ with a film thickness of 30 nm is formed on the GaN channel layer 23.

A source electrode 6S and a drain electrode 6D are formed in contact with the upper surface of the AlGaN electron supplying layer 24. The source electrode 6S and the drain electrode 6D are in ohmic contact with the AlGaN electron supplying layer 24. Furthermore, a gate electrode 27 is formed in contact with the upper surface of the AlGaN electron supplying layer 24. The gate electrode 27 is spaced between the source electrode 6S and the drain electrode 6D. The gate electrode is in Schottky contact with the AlGaN electron supplying layer 24. The gate electrode 27 has a two-layer laminated structure. More specifically, the two-layer laminated structure comprises a first metal layer which is in contact with the upper surface of the AlGaN doped layer and comprises a $Ni_{0.7}Si_{0.3}$ layer 271 with a film thickness of 15 nm, and a second metal layer which is in contact with the upper surface of the first metal layer and comprises an Au layer 272 with film thickness of 200 nm. The Ni0.7Si0.3 layer is in Shottky contact with the AlGaN electron supplying layer 24.

Furthermore, accompanying the piezo polarization effect and the spontaneous polarization effect attributable to the difference in grating constant between GaN and AlGaN, a two-dimensional electron gas is formed in the area within the GaN channel layer 23 in the vicinity of the interface with AlGaN electron supplying layer 24. The heterojunction field-effect transistor (HJFET) operates as a transistor by modulating the two-dimensional electron gas concentration with the potential of the gate electrode 27. The important point in the embodiment lies in the fact that the Schottky gate electrode 27 comprises a two-layer laminated structure wherein the first metal layer 271 comprises $Ni_ySi_{1-y}$ (where, 0<y<1) and the second metal layer 272 comprises Au which has a low resistivity as the metal materials having a high work function and a high melting point. Since the bonding force between Ni and Si in $Ni_ySi_{1-y}$ (where, 0<y<1), which is one example of metal silicates, is strong, it is more stable at high temperatures than simple substance Ni. Preferably, it is $0.4 \leq y \leq 0.75$. If it is $0.65 \leq y \leq 0.75$ in particular, the melting point is extremely high, approximately 1,200° C. or higher, and, in addition, it is more preferable since the increase in resistivity is smaller in comparison with Ni. For this reason, the thermal diffusion of metal of the first metal layer 271 to the semiconductor layer, with which the Schottky gate electrode 27 is in contact, is suppressed even at high temperatures. Furthermore, the interdiffusion between the metal in the second metal layer 272 and that in the first metal layer 271 at high temperatures is suppressed. As a result, the reliability of the device is enhanced. More specifically, in order to reduce the resistance of the Schottky gate electrode 27, the second metal layer 272 comprises a metal having low resistivity. On the other hand, in order to form a high Schottky barrier at the interface between the semiconductor layer and the Schottky electrode 27, and suppress the interdiffusion between the metal in the second metal layer 272 and the first metal layer at a high temperature and the thermal diffusion to the semiconductor layer with which the first metal layer 271 is in contact, the first metal layer 271 comprises a metal having a high work function and a high melting point, thereby making possible the enhancement of high temperature characteristics and high power performance of the semiconductor device through enabling the Schottky electrode 27 to have not only a high Schottky barrier and low resistivity, but also high heat resistance.

More specifically, since NiSi which is the metal material of the first metal layer 271 has a higher melting point than that of Au which is the material of the second metal layer 272, the interdiffusion between NiSi and Au is suppressed and the thermal diffusion to the semiconductor layer with which the first metal layer 271 is in contact is suppressed as well. In other words, since the first metal layer 271 comprises a metal having a high work function and a high melting point, not only is a Schottky barrier formed at the interface between the semiconductor layer and the Schottky gate electrode 27, but even if the Schottky gate electrode 27 rises to a high temperature, the interdiffusion between the metal in the first metal layer 271 and that in the second metal layer 272 is suppressed as well, and thereby, intermetallic alloying is suppressed. In addition, the thermal diffusion to the semiconductor layer which the first metal layer 271 contacts is suppressed. Although the first metal layer 271 comprises a metal having a high work function, by suppressing the alloying as stated above, the deterioration of the Schottky barrier at the interface between the AlGaN electron supplying layer 24 and the first metal layer 271 can be suppressed even at high temperatures, and an increase in the reverse directional gate current can be suppressed even at high temperatures. Thus, the gate leak current is suppressed even at high temperatures, heat resistance of the Schottky gate electrode 27 is improved, and as a result, the reliability of the device is enhanced. Therefore, enhancement of high temperature characteristics and high power performance of the semiconductor device is made possible by enabling the Schottky gate electrode 27 to have not only a high Schottky barrier and low resistance but also high heat resistance.

In this embodiment according to the present invention, although NiSi is given as one typical example of an intermetallic compound having a high work function and a high melting point which comprises the first metal layer 271, the foregoing effect can be obtained even if NiSi is replaced with, for example, another intermetallic compound having a high work function and a high melting point. Other typical examples of intermetallic compounds having a high work function and a high melting point comprising the first metal layer 271 include metal silicates and metal nitride such as PtSi, PdSi, NiN and PdN, but are not necessarily limited to these metals. More specifically, NiSi comprising the first metal layer 271 can be replaced with any of $Pt_ySi_{1-y}$ (where, $0.5 \leq y \leq 0.75$), $Pd_ySi_{1-y}$ (where, $0.5 \leq y \leq 0.85$), $Ni_yN_{1-y}$ (where, $0.5 \leq y \leq 0.85$) and $Pd_yN_{1-y}$ (where, $0.5 \leq y \leq 0.85$). If the melting points of the intermetallic compounds such as metal silicates and metal nitrides comprising the first metal layer 271 are 1,000° C. or higher, the foregoing effect can be obtained. Moreover, it is more preferable if the melting point is 1,500° C. or higher.

Figure 8A:
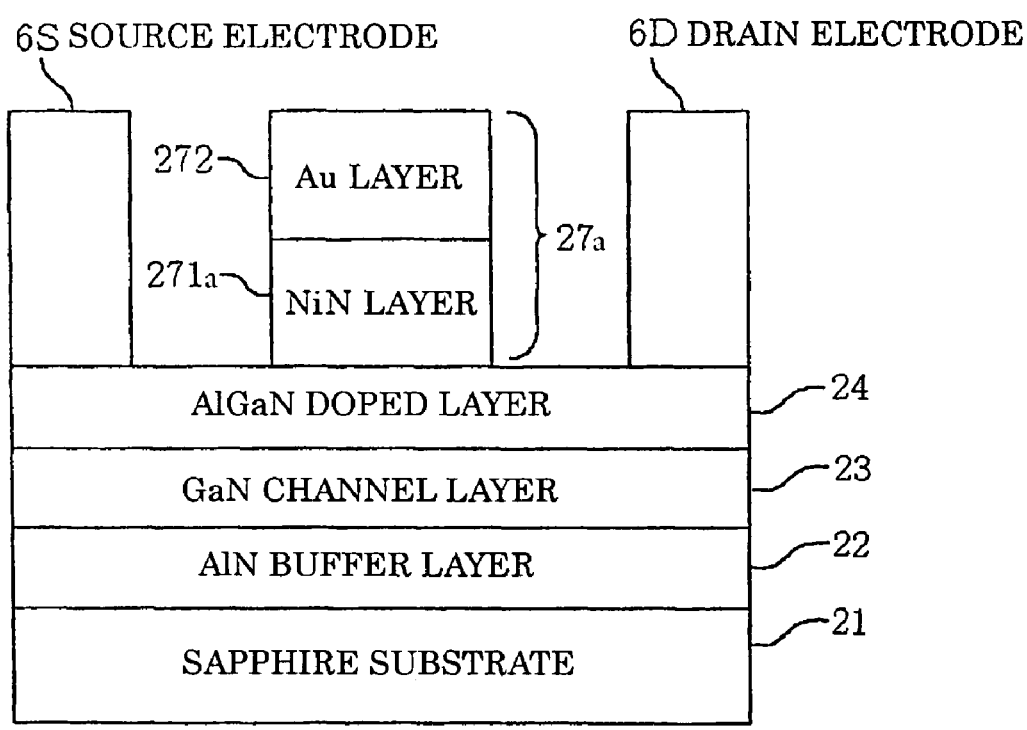
FIG. 8A is a local longitudinal sectional view showing the main structure of the AlGaN/GaN heterojunction Field-effect transistor in the second embodiment according to the present invention, but with an NiN layer instead of the NiSi layer of FIG. 8.

FIG. 8A shows a structure using a different intermetallic compound, in this case NiN. In this structure shown in FIG. 8A, an NiN layer 271a is used instead of NiSi layer 271 from FIG. 8 to form Schottky gate electrode 27a. In all other respects the structure remains the same as that shown in FIG. 8.

Furthermore, in this embodiment according to the present invention, although Au is given as one typical example of a metal element having a low resistivity which comprises the second metal layer 272, the foregoing effect can be obtained even if Au is replaced with, for example, another metal having a low resistivity. Other typical examples of metal elements having a low resistivity which comprise the second metal layer 272 include Cu, Al and Pt, but are not necessarily limited to these elements. More specifically, the second metal layer 272 comprising Au can be replaced with any of a Cu layer, an Al layer, and a Pt layer. Moreover, since the second metal layer 272 is a layer provided to reduce the resistance of the Schottky gate electrode as stated above, limitations to the materials and the like are unnecessary as long as the layer complies with the purpose.

Furthermore, in this embodiment according to the present invention, although the semiconductor layer with which the Schottky junction electrode is in contact comprises the AlGaN layer, the same effect as that in the foregoing can be obtained even if the afore-mentioned structure is applied to the Schottky junction electrode which is in Schottky contact with the GaN layer, the InAlN layer, the InGaN layer, the InAlGaN layer and the AlN layer. In addition, the same effect as that in the foregoing can be obtained even if the afore-mentioned structure is applied to the Schottky junction electrode which is in Schottky contact with a superlattice layer containing at least one layer out of the GaN layer, the AlGaN layer, the InAlN layer, the InGaN layer, the InAlGaN layer and the AlN layer. More specifically, the same effect as that in the foregoing can be obtained even if the aforementioned structure is applied to the Schottky junction electrode which is in Shottky contact with a semiconductor layer comprising a compound semiconductor using $Ga_vAl_{1-v}$ (where, $0 \leq v \leq 1$) as the main component of the Group III-elements and N as the main component of the Group V-element.

Furthermore, although the embodiments according to the present invention are described by giving a semiconductor device having a planar structure wherein the source electrode, the gate electrode, and the drain electrode are formed on the same semiconductor layer as an example, the same effect as that in the foregoing can be obtained even if the afore-mentioned structure is applied to the Schottky junction electrode on the semiconductor device having other Group III-nitride structures. As typical examples of structures other than the planar structure, it may be a recess structure wherein a cap layer selectively comprising an N-type semiconductor is formed under the source electrode and the drain electrode, or an embedded gate structure wherein the gate electrode is embedded in the semiconductor layer such as GaN and AlGaN.

THIRD EMBODIMENT

Figure 9:
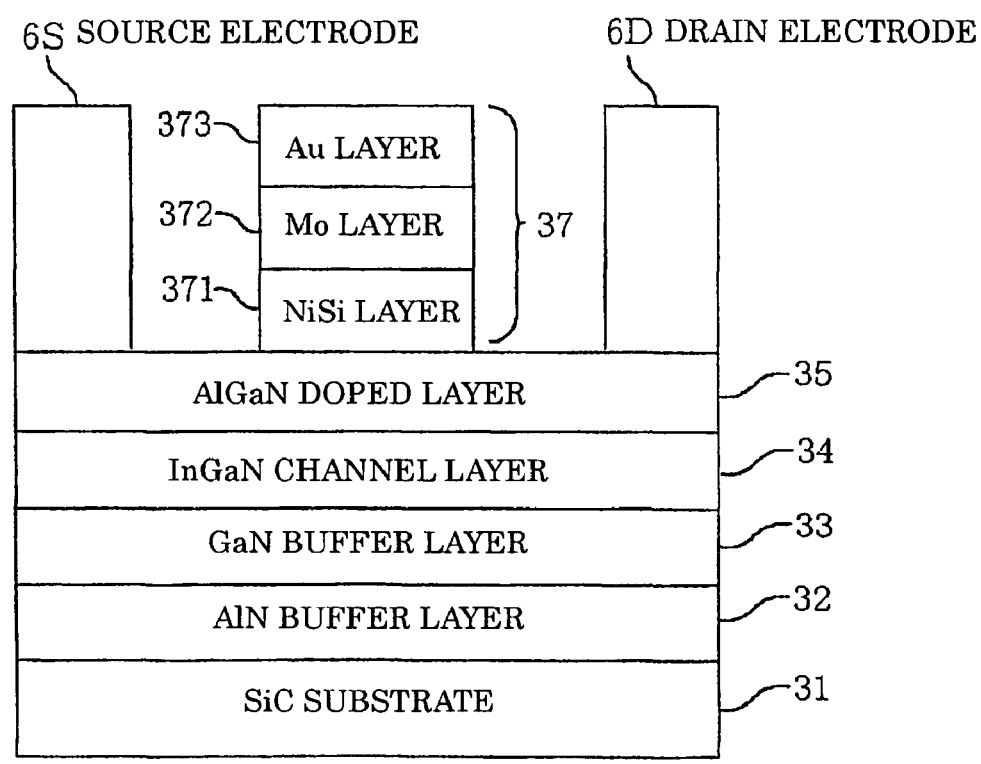
FIG. 9 is a local longitudinal sectional view showing the main structure of the AlGaN/GaN heterojunction field-effect transistor in a third embodiment according to the present invention.

Next, a third embodiment according to the present invention is described in reference to FIG. 9.

FIG. 9 is a local vertical view showing the main structure of an AlGaN/GaN heterojunction field-effect transistor (HJFET) in the third embodiment according to the present invention. The transistor is formed on a SiC substrate 31. In FIG. 9, an undoped AlN buffer layer 32 is formed on the SiC substrate 31, an undoped GaN buffer layer 33 with a film thickness of 2 µm is formed on the undoped AlN buffer layer 32, an InGaN channel layer 34 comprising an undoped $In_{0.1}Ga_{0.9}N$ with a film thickness of 15 nm is formed on the undoped GaN buffer layer 33, and an AlGaN electron supplying layer 35 comprising an undoped $Al_{0.2}Ga_{0.8}N$ with a film thickness of 40 nm is formed on the InGaN channel layer 34.

A source electrode 6S and a drain electrode 6D are formed in contact with the upper surface of the AlGaN electron supplying layer 35. The source electrode 6S and the drain electrode 6D are in ohmic contact with the AlGaN electron supplying layer 35. Furthermore, a gate electrode 37 is formed in contact with the upper surface of the AlGaN electron supplying layer 35. The gate electrode 37 is spaced between the source electrode 6S and the drain electrode 6D. The gate electrode 37 is in Schottky contact with the AlGaN electron supplying layer 35. The gate electrode 37 has a three-layer laminated structure. More specifically, the three-layer laminated structure comprises a first metal layer which is in contact with the surface of the AlGaN electron supplying layer 35 and comprises a Ni0.7Si0.3 layer 371, a second metal layer which is in contact with the upper surface of the first metal layer and comprises a Mo layer 372 and a third metal layer which is in contact with the upper surface of the second metal layer and comprises an Au layer 373. The first metal layer comprising the Ni0.7Si0.3 Layer 371 is in Schottky contact with the AlGaN electron supplying layer 35.

In addition, accompanied by the piezo polarization effect and spontaneous polarization effect attributable to the difference in grating constant between InGaN and AlGaN, a two-dimensional electron gas is formed in the area within the InGaN channel layer 34 in the vicinity of the interface with the AlGaN layer 35. The heterojunction field-effect transistor (HJFET) operates as a transistor by modulating the two-dimensional electron gas concentration with the potential of the gate electrode 37.

The important point in this embodiment lies in the fact that the Schottky gate electrode 37, comprises a three-layered laminated structure wherein a first metal layer 371 comprises $Ni_ySi_{1-y}$ (where, $0<y<1$) as the metal material having a high work function and high melting point, a second metal layer 372 comprises Mo which is a metal having a higher melting point than that of the first metal layer 371, and a third metal layer 373 comprises Au which is a metal having a low resistivity. More specifically, since the bonding force between Ni and Si in $Ni_ySi_{1-y}$ ($0<y<1$), which is one example of metal silicates, is strong, it is more stable at high temperatures than single substance, Ni. Preferably, it is $0.4 \leq y \leq 0.75$. If it is $0.65 \leq y \leq 0.75$ in particular, the melting point extremely high, approximately 1,200° C., and in addition, it is more preferable since the increase in resistivity is smaller in comparison with Ni. For this reason, the thermal diffusion of the metal in the first metal layer 371 to the semiconductor layer, with which the Schottky electrode 37 is in contact, is suppressed even at high temperatures. Furthermore, the interdiffusion between the metal in the first metal layer 371 and that in the second metal layer 372 at high temperatures is also suppressed. As a result, the reliability of the device is enhanced.

More specifically, in order to reduce the resistance of the Schottky gate electrode 37, the third metal layer 373 comprises a metal having a low resistivity. On the other hand, in order to form a high Schottky barrier at the interface between the semiconductor layer and the Schottky gate electrode 37 and suppress the interdiffusion between the metal in the third metal layer 373 and that in the first metal layer 371 and the thermal diffusion of the metal to the semiconductor layer, with which the first metal layer 371 is connected, at high temperatures, the first metal layer 371 comprises a metal having a high work function and high melting point.

In addition, in order to more definitely prevent the interdiffusion between the metal in the first metal layer 371 and that in the third metal layer 373 at high temperatures, the second metal layer 372 which comprises a metal having a higher melting point than that in the first metal layer 371 is interposed between the first metal layer 371 and the third metal layer 373, thereby making possible enhancement of the high temperature characteristics and high power performance of the semiconductor device through enabling the Schottky gate electrode 37 to have not only a high Schottky barrier and low resistance but also extremely high heat resistance.

More specifically, even when comparing Mo, which is the metal material of the second metal layer 372, with NiSi, which is the metal material of the first metal layer 371, and Au, which is the metal material of the third metal layer 373, since the melting point of Mo is extremely high, approximately 2,630° C., it works as a barrier to the interdiffusion of Ni and Au. In other words, since the second metal layer 372, which is interposed between the first metal layer 371 and the second metal layer 373, has a higher melting point than those of the first metal layer 371 and the third metal layer 373, even if the Schottky gate electrode 37 rises to high temperatures, the interdiffusion between the metal in the first metal layer 371 and that in the third metal layer 373 is suppressed, thereby suppressing the alloying between these metals. Although the first metal layer 371 comprises a metal having a high work function, the deterioration of the Schottky barrier at the interface between the AlGaN electron supplying layer 35 and the first metal layer 371 and increase in the reverse directional gate current can be suppressed even at high temperatures, by suppressing the alloying as stated above. Thus, the gate leak current is suppressed even at high temperatures, heat resistance of the Schottky gate electrode 37 is improved, and as a result, the reliability of the device is enhanced. Therefore, enhancement of high temperature characteristics and high power performance of the semiconductor device is made possible through enabling the Schottky gate electrode 37 to have not only a high Schottky barrier and low resistance, but also high heat resistance.

In this embodiment according to the present invention, although NiSi is given as one typical example of an intermetallic compound having a high work function and a high melting point which comprises the first metal layer 371, the same effect as in the foregoing can be obtained even if NiSi is replaced with, for example, another intermetallic compound having a high work function and a high melting point. Other typical examples of the intermetallic compounds having a high work function and a high melting point comprising the first metal layer 371 include metal silicates and metal nitrides such as PtSi, PdSi, NiN and PdN, but are not necessarily limited to these metals. More specifically, NiSi comprising the first metal layer 371 can be replaced with any of $Pt_ySi_{1-y}$ (where, $0.5 \leq y \leq 0.75$), $Pd_ySi_{1-y}$ (where, $0.5 \leq y \leq 0.85$), $Ni_yN_{1-y}$ (where, $0.5 \leq y \leq 0.85$) and $Pd_yN_{1-y}$ (where $0.5 \leq y \leq 0.85$). If the melting points of the intermetallic compounds such as metal silicates and metal nitrides comprising the first metal layer 371 are 1,000° C. or higher, the forgoing effect can be obtained. Moreover, it is more preferable if the melting point is 1,500° C. or higher.

In this embodiment according to the present invention, although Mo is given as one typical example of a metal element having a high melting point which comprises the second metal layer 372, the foregoing effect can be obtained even if Mo is replaced with, for example, another metal element having a high melting point. Other typical examples of metal elements each having a high melting point which comprise the second metal layer 372 include Pt, W, Ti and Ta, but are not necessarily limited to these elements. More specifically, the second metal layer 372 comprising Mo can be replaced with any of the Pt layer, the W layer, the Ti layer and the Ta layer.

The same effect as that in the foregoing can be obtained even if the afore-mentioned metal element having a high melting point is replaced with intermetallic compounds such as metal silicates and metal nitrides which have a high melting point and are thermally stable as the metal element comprising the second metal layer 372. For example, the metal materials which comprise the second metal layer 372 can be replaced with any of $Mo_xSi_{1-x}$ layer (where, $0<x<1$), $Pt_xSi_{1-x}$ layer (where, $0<x<1$), $W_xSi_{1-x}$ layer (where, $0<x<1$), $Ti_xSi_{1-x}$ layer (where, $0<x<1$), $Ta_xSi_{1-x}$ layer (where, $0<x<1$), $Mo_xN_{1-x}$ layer (where, $0<x<1$), $W_xN_{1-x}$ (where, $0<x<1$), $Ti_xN_{1-x}$ layer (where, $0<x<1$), and $Ta_xN_{1-x}$ layer (where, $0<x<1$). If the melting points of the metal element or the intermetallic compound such as metal silicate and metal nitride which comprise the second metal layer 372 are 1,000° C. or higher, the forgoing effect can be obtained.

Moreover, it is more preferable if the melting point is 1,500° C. or higher. Furthermore, in this embodiment according to the present invention, although Au is given as one typical example of a metal element having a low resistivity which comprises the third metal layer 373, the forgoing effect can be obtained even if Au is replaced with, for example, another metal element having a low resistivity. Other typical examples of metal elements having a low resistivity which comprise the third metal layer 373 include Cu, Al and Pt, but are not necessarily limited to these elements. More specifically, the third metal layer 373 which comprises Au can be replaced with any of the Cu layer, the Au layer and the Pt layer. Since the third metal layer 373 is a layer provided to reduce the resistance of the Schottky gate electrode as stated above, limitations to the materials and the like are unnecessary as long as the layer complies with the purpose.

Furthermore, in this embodiment according to the present invention, although the semiconductor layer with which the Schottky junction electrode is in contact comprises the AlGaN layer, the same effect as that in the foregoing can be obtained even if the afore-mentioned structure is applied to the Schottky junction electrode which is in Schottky contact with the GaN layer, the InAlN layer, the InGaN layer, the InAlGaN layer, and the AlN layer. In addition, the same effect as that in the foregoing can be obtained even if the afore-mentioned structure is applied to the Schottky junction electrode which is in Schottky contact with a superlattice layer containing at least one layer out of the GaN layer, the InAlN layer, the InGaN layer, the InAlGaN layer and the AlN layer. More specifically, the same effect as that in the foregoing can be obtained even if the afore-mentioned structure is applied to the Schottky junction electrode which is in Schottky contact with the semiconductor layer comprising a compound semiconductor using $Ga_vAl_{1-v}$ (where, $0 \leq v \leq 1$) as the main components of the Group III-elements and N as the main component of the Group V-element.

Furthermore, although the embodiment according to the present invention is described by giving the semiconductor device having a planar structure wherein the source electrode, the gate electrode, the drain electrode are formed on the same semiconductor layer as an example, the same effect as that in the foregoing can be obtained even if the afore-mentioned structure is applied to the Schottky junction electrode on the semiconductor device having other Group III-nitride structures. As typical examples of structures other than the planar structure, it may be a recess structure wherein a cap layer selectively comprising GaN-type semiconductor is formed under the source electrode and the drain electrode or an embedded gate structure wherein the gate electrode is embedded in a semiconductor layer such as GaN and AlGaN.

FOURTH EMBODIMENT

Figure 10:
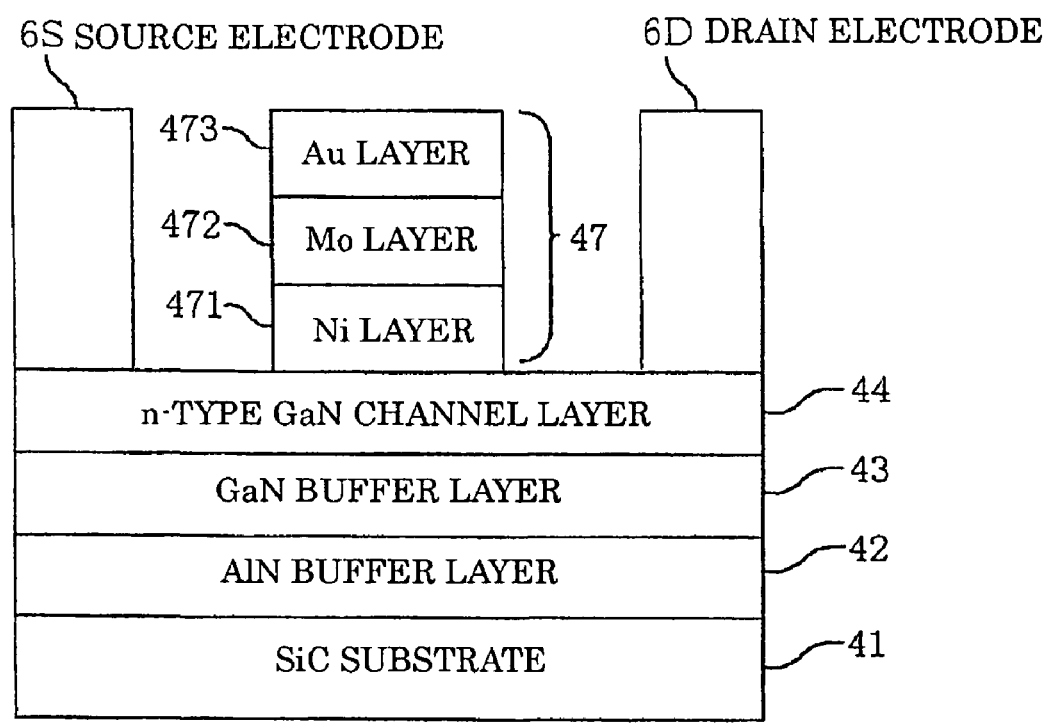
FIG. 10 is a local longitudinal sectional view showing the main structure of the GaN metal-semiconductor field-effect transistor in a fourth embodiment according to the present invention.

Next, a fourth embodiment according to the present invention is described in reference to FIG. 10.

FIG. 10 is a local longitudinal sectional view showing the main structure of a GaN metal-semiconductor field-effect transistor (MESFET) in the fourth embodiment according to the present invention. The transistor is formed on a SiC substrate 41. In FIG. 10, an undoped AlN buffer layer 42 is formed on the SiC substrate 41, an undoped GaN buffer layer 43 with a film thickness of 1 μm is formed on the undoped AlN buffer layer 42, and a n-type GaN channel layer 44 with an impurity concentration of 2×1017.cm3 and a film thickness of 150 nm is formed on the undoped GaN buffer layer 43.

A source electrode 6S and a drain electrode 6D are formed in contact with the upper surface of the n-type GaN channel layer 44. The source electrode 6S and the drain electrode 6D are in ohmic contact with the n-type GaN channel layer 44.

Furthermore, a gate electrode 47 is formed in contact with the upper surface of the n-type GaN channel layer 44. The gate electrode 47 is spaced between the source electrode 6S and the drain electrode 6D. The gate electrode 47 is in Schottky contact with the n-type GaN channel layer 44. The gate electrode 47 has a three-layer laminated structure. More specifically, the three-layer laminated structure comprises a Ni layer 471 which is in contact with the upper surface of the n-type GaN channel layer 44, a Mo layer which is in contact with the upper surface of the Ni layer 471 and an Au layer 473 which is contact with the upper surface of the Mo layer 472. The Ni layer 471 is in Schottky contact with the n-type GaN channel layer 44.

A depletion layer is formed in the area within the n-type GaN channel layer 44 in the vicinity of the interface with the gate electrode 47. A metal-semiconductor field-effect transistor (MESFET) operates as a transistor by modulating the thickness of the depletion layer with the potential of the gate electrode 47.

In this embodiment according to the present invention, although the channel layer comprises n-type GaN, it may be replaced with an n-type InGaN.

In this embodiment according to the present invention, the structure of the gate electrode 47 is the same as that of the gate electrode structure 17 in the first embodiment, shown in FIG. 5. In other words, in this embodiment according to the present invention, the gate electrode structure 17 in the first embodiment shown in FIG. 5 is applied to the GaN metal-semiconductor field-effect transistor (MESFET). Therefore, the same effect as that described in the first embodiment can be obtained.

The important point in this embodiment lies in the fact that the Schottky gate electrode 47 comprises a three-layered laminated structure wherein a first metal layer 471 comprises Ni as the metal having a high work function, the second metal layer 472 comprises Mo which is the metal having a high melting point and the third metal layer 473 comprises Au which is the metal having a low resistivity. More specifically, in order to form a high Schottky barrier at the interface between the semiconductor layer and the Schottky gate electrode 47, the first metal layer 471 comprises a metal having a high work function, and on the other hand, in order to reduce the resistance of the Schottky gate electrode 47, the third metal layer 473 comprises a metal having low resistivity. Furthermore, in order to prevent the interdiffusion between the first metal layer 471 and the third metal layer 473 at high temperatures, the second metal layer 472 comprising a metal having a high melting point is interposed between the first metal layer 471 and the third metal layer 473, thereby making possible enhancement of the high temperature characteristics and high power performance of the semiconductor device through enabling the Schottky gate electrode 47 to have not only a high Schottky barrier and low resistance, but also high heat resistance.

More specifically, when comparing Mo, which is the metal material of the second metal layer 472, with Ni, which is the metal material of the first metal layer 471, and Au, which is the metal material of the third metal layer 473, since the melting point of Mo is extremely high, approximately 2,630° C., the layer works as a barrier layer to the interdiffusion between Ni and Au. In other words, since the second metal layer 472 which is interposed between the first metal layer 471 and the third metal layer 473 has a higher meting point those of the first metal layer 471 and the third metal layer 473, even if the Schottky gate electrode 47 rises to a high temperature, the interdiffusion between the metal in the first metal layer 471 and that in the third metal layer 473 is suppressed, thereby suppressing the alloying between these metals. Although the first metal layer 471 comprises a metal having a high work function, the deterioration of the Schottky barrier at the interface between the n-type GaN channel layer 44 and the first metal layer 471 and increase in the reverse directional gate current can be suppressed even at high temperatures, by suppressing the alloying as stated above. Thus, the gate leak current is suppressed even at high temperatures, the heat resistance of the Schottky gate electrode 47 is improved, and as a result, the reliability of the device is enhanced. Therefore, enhancement of the high temperature characteristics and high power performance of the semiconductor device is made possible through enabling the Schottky gate electrode 47 to have not only a high Schottky barrier and low resistance, but also high heat resistance.

In this embodiment according to the present invention, although Mo is given as one typical example of a metal element having a high melting point which comprises the second metal layer 472, the foregoing effect can be obtained even if Mo is replaced with, for example, another metal element having a high melting point. Other typical examples of metal elements having a high melting point which comprise the second metal layer 472 include Pt, W, Ti and Ta, but are not necessarily limited to these elements. More specifically, the second metal layer 472 which comprises Mo can be replaced with any of the Pt layer, the W layer, the Ti layer and the Ta layer.

The same effect as that in the foregoing can be obtained even if the afore-mentioned metal element is replaced with intermetallic compounds such as metal silicates and metal nitrides which have a high melting point and are thermally stable as the metal material comprising the second metal layer 472. For example, the metal materials which comprise the second metal layer 472 can be replaced with any of $Mo_xSi_{1-x}$ layer (where, $0<x<1$), $Pt_xSi_{1-x}$ layer (where, $0<x<1$), $W_xSi_{1-x}$ layer (where, $0<x<1$), $Ti_xSi_{1-x}$ layer (where, $0<x<1$), $Ta_xSi_{1-x}$ layer (where, $0<x<1$), $Mo_xN_{1-x}$ layer (where, $0<x<1$), $W_xN_{1-x}$ (where, $0<x<1$), $Ti_xN_{1-x}$ (where, $0<x<1$), and $Ta_xN_{1-x}$ (where, $0<x<1$). If the melting points of the metal element or the intermetallic compounds such as metal silicates and metal nitrides which comprise the second metal layer 472 are 1,000° C. or higher, the forgoing effect can be obtained. Moreover, it is more preferable if the melting point is 1,500° C. or higher.

In this embodiment according to the present invention, although Ni is given as one typical example of a metal element having a high work function which comprises the first metal layer 471, the foregoing effect can be obtained even if Ni is replaced with, for example, another metal element having a high work function. Other typical examples of metal elements having a high work function which comprise the first metal layer 471 include Pt and Pd, but are not necessarily limited to these elements. More specifically, the first metal layer 471 which comprises Ni can be replaced with any of the Pt layer and the Pd layer.

Furthermore, in this embodiment according to the present invention, although Au is given as one typical example of a metal element having a low resistivity which comprises the third metal layer 473, the forgoing effect can be obtained even if Au is replaced with, for example, another metal element having low resistivity. Other typical examples of metal elements having a low resistivity which comprise the third metal layer 473 include Cu, Al, and Pt, but are not necessarily limited to these elements. More specifically, the third metal layer 473 which comprises Au can be replaced with any of the Cu layer, the Au layer and the Pt layer. In addition, since the third metal layer 473 is a layer provided to reduce the resistance of the Schottky gate electrode as stated above, limitations to the materials and the like are unnecessary as long as the layer complies with the purpose.

FIFTH EMBODIMENT

Figure 11:
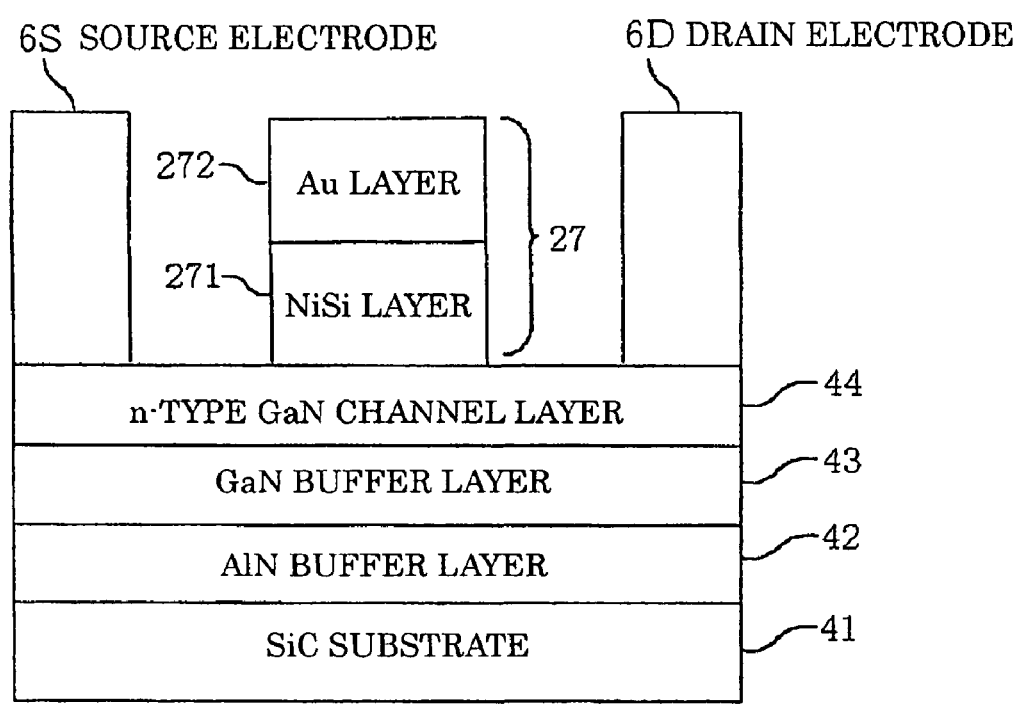
FIG. 11 is a local sectional longitudinal view showing the main structure of the GaN metal-semiconductor field-effect transistor in a fifth embodiment according to the present invention.

Next, a fifth embodiment according to the present invention is described in reference to FIG. 11.

Figure 1:
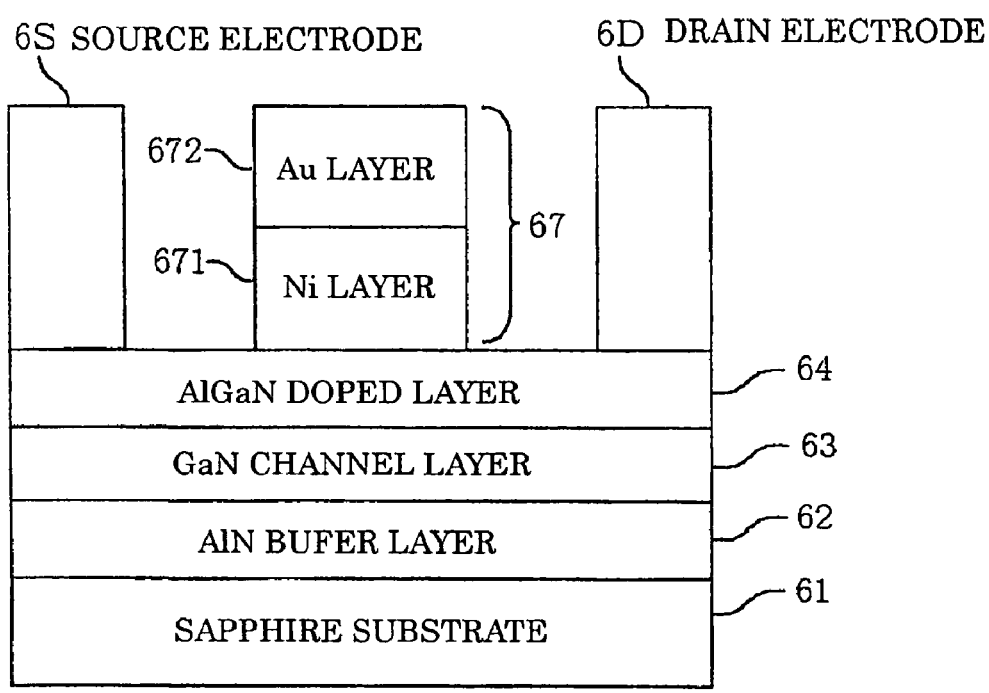
FIG. 1 is a local longitudinal sectional view of a semiconductor which has a conventional Schottky junction electrode.
Figure 2:
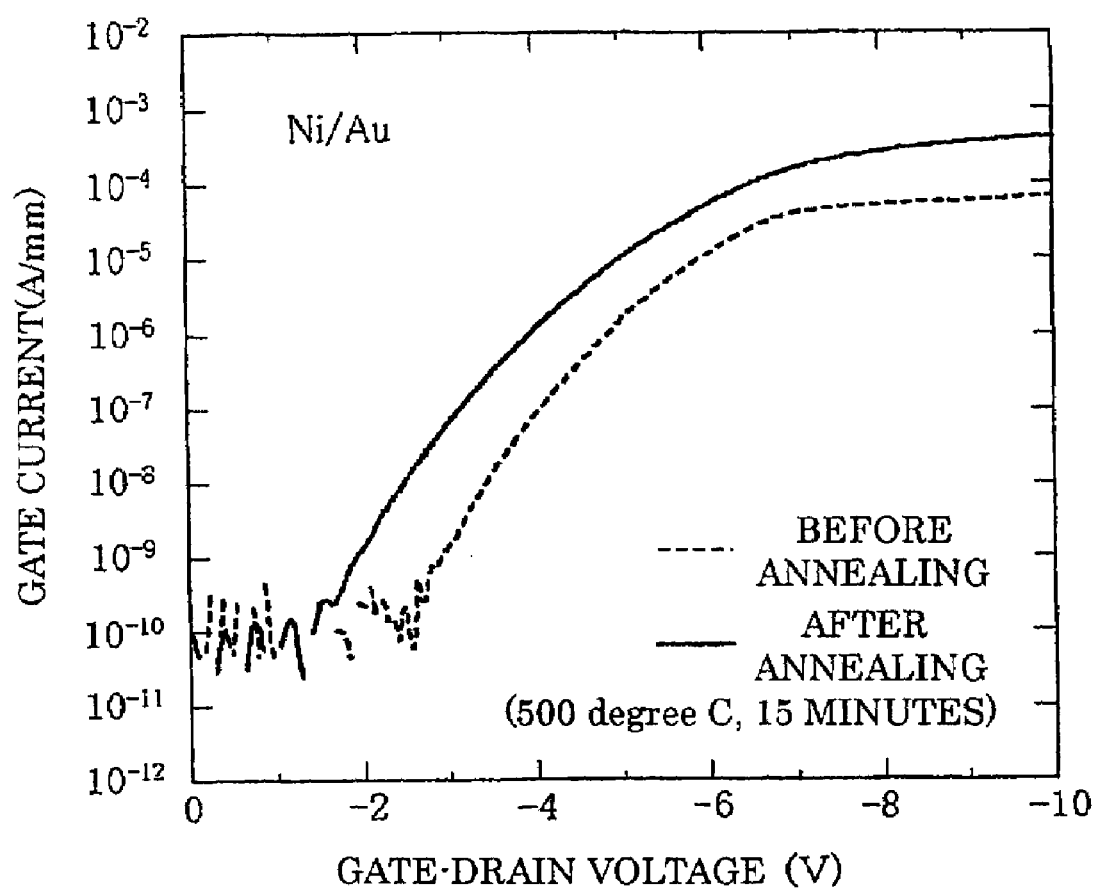
FIG. 2 is a diagram showing the reverse directional gate current-voltage characteristics measured before and after heat treatment is performed on the semiconductor device shown in FIG. 1.
Figure 3:
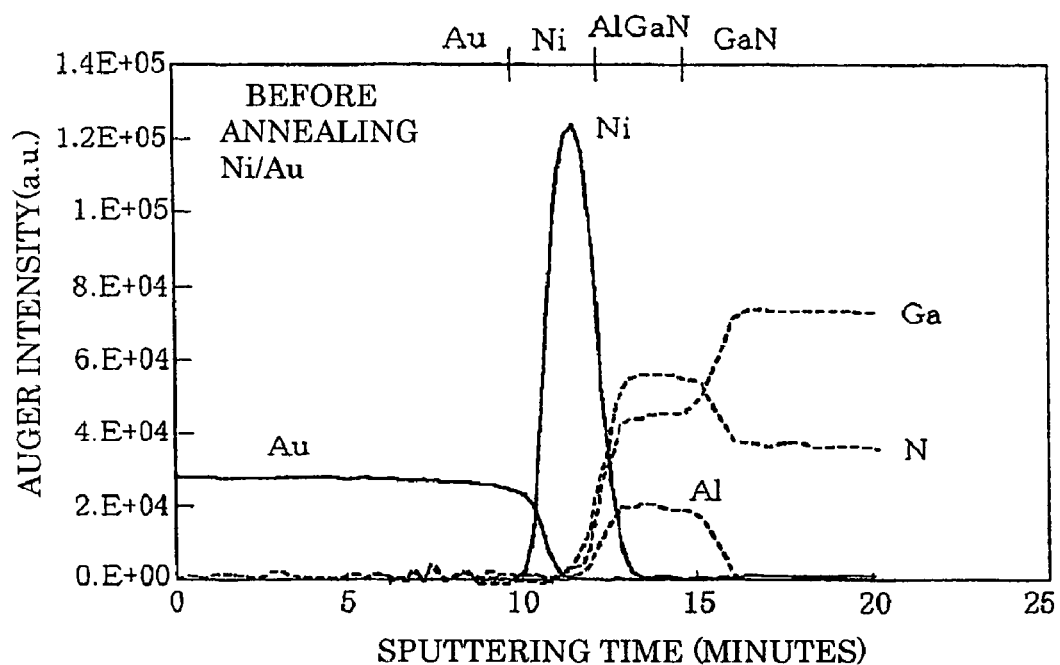
FIG. 3 is a diagram showing the Auger profile before heat treatment is performed on the conventional semiconductor device shown in FIG. 1.
Figure 4:
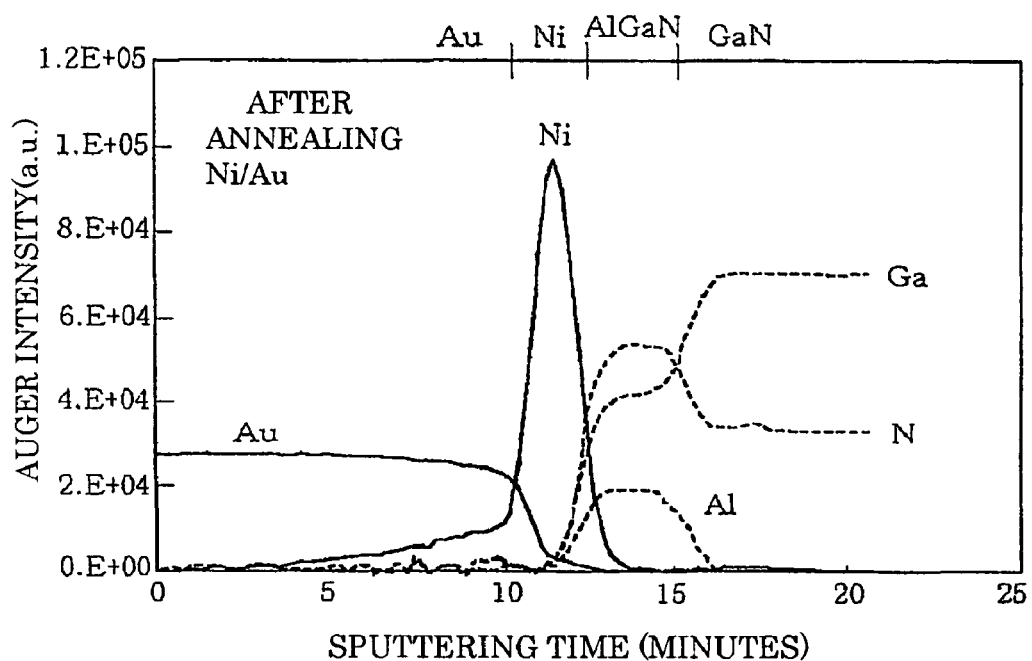
FIG. 4 is a diagram showing the Auger profile after heat treatment is performed on the conventional semiconductor device shown in FIG. 1.

FIG. 11 is a local longitudinal sectional view showing the main structure of a GaN metal-semiconductor field-effect transistor (MESFET) in the fifth embodiment according to the present invention. This embodiment according to the present invention has the same structure as the GaN metal-semiconductor field-effect transistor (MESFET) in the fourth embodiment, except that the gate electrode 47 in the fourth embodiment shown in FIG. 10 is replaced with the gate electrode 27 in the second embodiment in FIG. 8. Therefore, the detailed description of the forgoing effects brought about by the gate electrode structure 27 shown in FIG. 2 also applies to the embodiment herein, and thereby, repetitive explanations are omitted. In addition, the description of other metal materials which can replace those in the gate electrode structure 27 also applies to the embodiment herein, and thereby, repetitive explanations are omitted.

SIXTH EMBODIMENT

Figure 12:
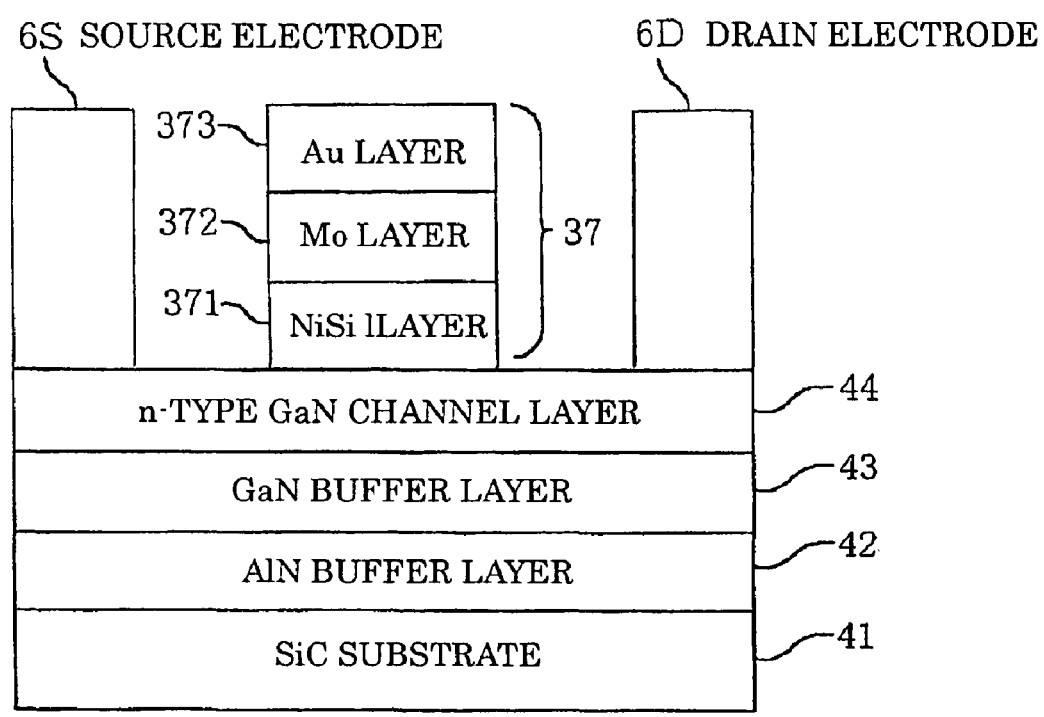
FIG. 12 is a local longitudinal sectional view showing the main structure of the GaN metal-semiconductor field-effect transistor in a sixth embodiment according to the present invention.

Next, a sixth embodiment according to the present invention is described in reference to FIG. 12.

FIG. 12 is a local longitudinal sectional view showing the main structure of a GaN metal-semiconductor field-effect transistor (MESFET) in the sixth embodiment according to the present invention. This embodiment according to the present invention has same structure as the GaN metal-semiconductor field-effect transistor (MESFET) in the fourth embodiment, except that the gate electrode 47 in the fourth embodiment shown in FIG. 10 is replaced with the gate electrode 37 in the second embodiment in FIG. 9. Therefore, the detailed description of the forgoing effects brought about by the gate electrode structure 37 in the third embodiment shown in FIG. 9 also applies to the embodiment herein, and thereby, repetitive explanations are omitted. In addition, the description of other metal materials which can replace those in the gate electrode structure 37 also applies to the embodiment herein, and thereby, repetitive explanations are omitted.

SEVENTH EMBODIMENT

Figure 13:
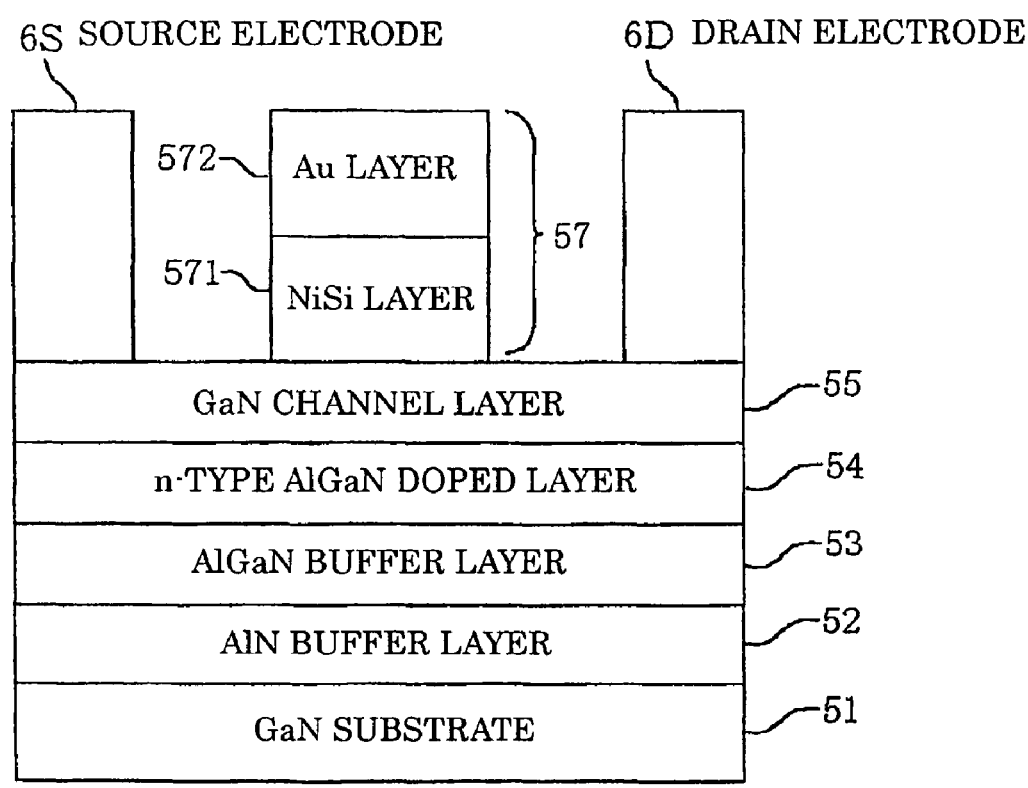
FIG. 13 is a local longitudinal sectional view showing the main structure of the AlGaN/GaN heterojunction field-effect transistor in a seventh embodiment according to the present invention.

Next, a seventh embodiment according to the present invention is described in reference to FIG. 13.

FIG. 13 is a local longitudinal sectional view showing the main structure of a GaN/AlGaN heterojunction field-effect transistor (HJFET) in the seventh embodiment according to the present invention. The transistor is formed on a GaN substrate 51. In FIG. 13, an undoped AlN buffer layer 52 is formed on the GaN substrate 51, an undoped GaN channel layer 53 with a film thickness of 1 µm is formed on the undoped AlN buffer layer 52, a n-type AlGaN electron supplying layer 54 comprising a n-type $Al_{0.2}Ga_{0.8}N$ with an impurity concentration of $2\times1018/cm3$ and a film thickness of 30 nm is formed on the undoped GaN channel layer 53, and an undoped GaN channel layer 55 is formed on the n-type AlGaN electron supplying layer 54.

A source electrode 6S and a drain electrode 6D are formed by contacting the upper surface of the GaN channel layer 55. The source electrode 6s and the drain electrode 6D are in ohmic contact with the GaN channel layer 55.

Furthermore, a gate electrode 57 is formed in contact with the upper surface of the GaN channel layer 55. The gate electrode 57 is spaced between the source electrode 6S and the drain electrode 6D. The gate electrode 57 is in Schottky contact with the GaN channel layer 55. The gate electrode 57 has a two-layer laminated structure. More specifically, the two-layer laminated structure comprises a first metal layer comprising a $Ni_{0.5}Si_{0.5}$ layer 571 which is in contact with the upper surface of the n-type GaN channel layer 55 and a second metal layer comprising an Au layer 572 which is in contact with the upper surface of the first metal layer 572. The $Ni_{0.5}Si_{0.5}$ layer 571 is in Schottky contact with the GaN channel layer 55.

A two-dimensional electron gas is formed in the area within the GaN channel layer 55 in the vicinity of the interface with the AlGaN electron supplying layer 54. The heterojunction field-effect transistor (HJFET) operates as a transistor by modulating the two-dimensional electron gas concentration with the potential of the gate electrode 57. In this embodiment according to the present invention, although the channel layer comprises GaN, it may be replaced with InGaN.

In this embodiment according to the present invention, the structure of the gate electrode 57 is the same as the gate electrode structure 27 in the second embodiment shown in FIG. 8. In other words, in the embodiment herein, the gate electrode structure 27 in the second embodiment shown in FIG. 8 is applied to the GaN/AlGaN heterojunction field-effect transistor (HJFET). Therefore, the same effect as that described in the first embodiment can be obtained.

The important point in this embodiment lies in the fact that the Schottky electrode 57 comprises a two-layer laminated structure wherein a first metal layer 571 comprises $Ni_ySi_{1-y}$ (where, $0<y<1$) as metal materials having a high work function and high melting point, and the second metal layer 572 comprises Au which is a metal having low resistivity. Since the bonding force between Ni and Si in $Ni_ySi_{1-y}$ (where, $0<y<1$), which is example of metal silicates, is strong, it is more stable at high temperatures than simple substance, Ni. Preferably, it is $0.4 \leq y \leq 0.75$. If it is $0.4 \leq y \leq 0.75$ in particular, the melting point is extremely high, approximately 1,200° C. or higher, and in addition, it is more preferable since the increase in resistivity is smaller in comparison with Ni. For this reason, the thermal diffusion of the metal in the first metal layer 571 to the semiconductor layer, with which the Schottky gate electrode 57 is in contact, is suppressed even at high temperatures. Furthermore, the interdiffusion between the metal in the second metal layer 572 and that in the first metal layer 571 at high temperatures is suppressed. As a result, the reliability of the device is enhanced. More specifically, in order to reduce the resistance of the Schottky gate electrode 57, the second metal layer 572 comprises a metal having a low resistivity. On the other hand, in order to form a high Schottky barrier at the interface between the semiconductor layer and the Schottky gate electrode 57, and to suppress the interdiffusion between the metal in the second metal layer 572 and the semiconductor layer at high temperatures and the thermal diffusion of the metal to the semiconductor layer, with which the first metal layer 571 is in contact, at high temperatures, the first metal layer 571 comprises a metal having a high work function and a high melting point, thereby making possible enhancement of the high temperature characteristics and high power performance of the semiconductor layer through enabling the Schottky gate electrode 57 to have not only a high Schottky barrier and low resistivity, but also high heat resistance.

More specifically, since NiSi, which is the metal material of the first metal layer 571, has a higher melting point even in comparison with Au, which is the metal material of the second metal layer 572, the interdiffusion between NiSi and Au and the thermal diffusion to the semiconductor layer with which the first metal 571 is in contact is suppressed. In other words, since the first metal layer 571 comprises a metal having a high work function and a high melting point, not only is a high Schottky barrier formed at the interface between the semiconductor layer and the Schottky gate electrode 57, but in addition, even if the Schottky gate electrode 57 rises to a high temperature, the interdiffusion between the metal in the first metal layer 571 and that in the second metal layer 572 is suppressed, thereby suppressing the alloying between the metals. Furthermore, the thermal diffusion of the metal to the semiconductor layer with which the first metal layer 571 is in contact is suppressed. Although the metal layer 571 comprises a metal having a high work function, the deterioration of the Schottky barrier at the interface between the GaN channel layer and the first metal layer 571 and increase in the reverse directional gate current can be suppressed even at high temperatures, by suppressing the alloying as stated above. For this reason, the gate leak current is suppressed even at high temperatures, the heat resistance of the Schottky gate electrode 57 is improved, and as a result, the reliability of the device is enhanced. Therefore, enhancement of the high temperature characteristics and high power performance of the semiconductor layer is made possible through enabling the Schottky gate electrode 27 to have not only a high Schottky barrier and low resistance, but also high heat resistance.

In this embodiment according to the present invention, although NiSi was given as one typical example of an intermetallic compound having a high work function and a high melting point which comprises the first metal layer 571, the foregoing effect can be obtained even if NiSi is replaced with, for example, another intermetallic compound having a high work function and a high melting point. Other typical examples of intermetallic compounds having a high work function and a high melting point which comprises the first metal layer 571 include other metal silicates and metal nitrides such as PtSi, PdSi, NiN and PdN, but are not necessarily limited to these compounds. More specifically, NiSi which comprises the first metal layer 571 can be replaced with any of $Pt_ySi_{1-y}$ (where, $0.5 \leq y \leq 0.75$), $Pd_ySi_{1-y}$ (where, $0.5 \leq y \leq 0.85$), $Ni_yN_{1-y}$ (where, $0.5 \leq y \leq 0.85$), and $Pd_yN_{1-y}$ (where, $0.5 \leq y \leq 0.85$). The forgoing effect can be obtained if the melting point of the intermetallic compound, such as the metal silicate and metal nitride, comprising the first metal layer 571 is 1,000° C. or higher. In addition, it is more preferable if the melting point is 1,500° C. or higher.

Furthermore, in this embodiment according to the present invention, although Au is given as one typical example of the metal element having a low resistivity comprising the second metal layer 572, the forgoing effect can be obtained even if Au is replaced with, for example, another metal element having a low resistivity. Other typical examples of metal elements having a low resistivity which comprise the second metal layer 572 include Cu, Al, and Pt, but are not necessarily limited to these elements. More specifically, the second metal layer 572 which comprises Au can be replaced with any of the Cu layer, the Al layer, and the Pt layer. In addition, since the second metal layer 572 is a layer provided to reduce the resistance of the Schottky gate electrode as stated above, limitations to the materials and the like are unnecessary as long as the layer complies with the purpose.

EIGHTH EMBODIMENT

Figure 14:
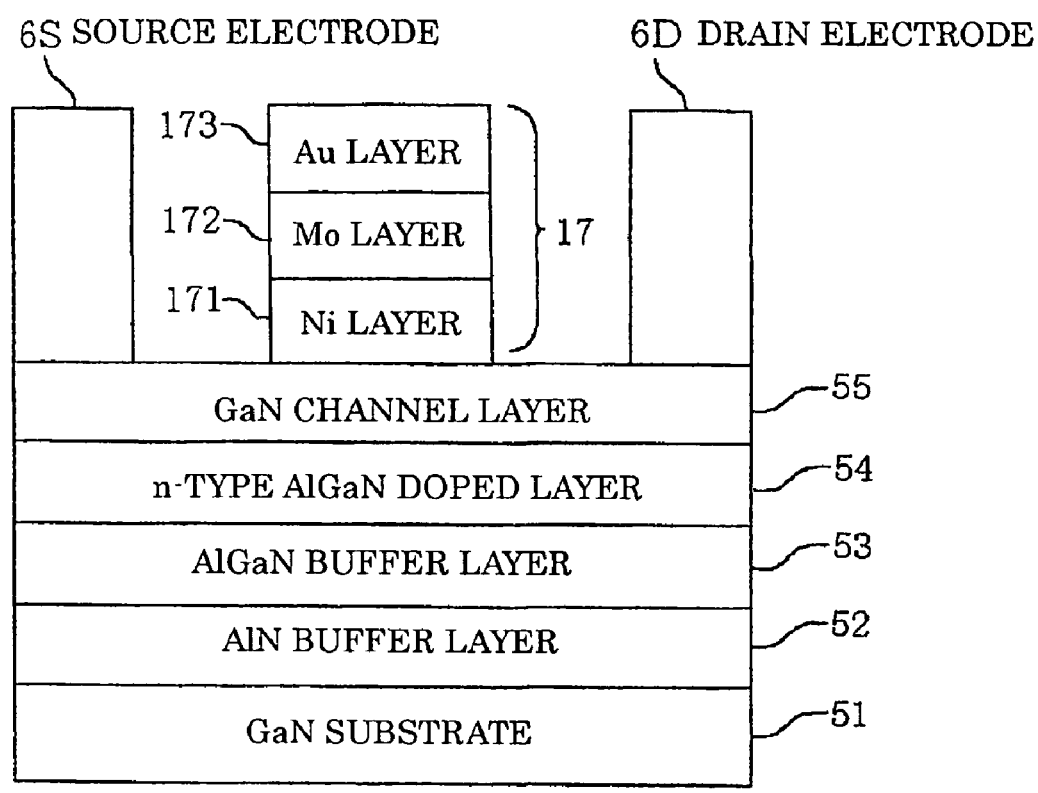
FIG. 14 is a local longitudinal sectional view showing the main structure of the AlGaN/GaN heterojunction field-effect transistor in an eighth embodiment according to the present invention.

Next, an eighth embodiment according to the present invention is described in reference to FIG. 14.

FIG. 14 is a local longitudinal sectional view showing the main structure of a GaN/AlGaN heterojunction field-effect transistor (HJFET) in the eighth embodiment according to the present invention. This embodiment according to the present invention has the same structure as the GaN/AlGaN heterojunction field-effect transistor (HJFET) in the seventh embodiment, except that the gate electrode 57 in the seventh embodiment shown in FIG. 13 is replaced with the gate electrode 17 in the second embodiment in FIG. 5. Therefore, the detailed description of the forgoing effects brought about by the gate electrode structure 17 in the first embodiment shown in FIG. 5 also applies to the embodiment herein, and thereby, repetitive explanations are omitted. In addition, the description of other metal materials which can replace those in the gate electrode structure 17 also applies to the embodiment herein, and thereby, repetitive explanations are omitted.

NINTH EMBODIMENT

Figure 15:
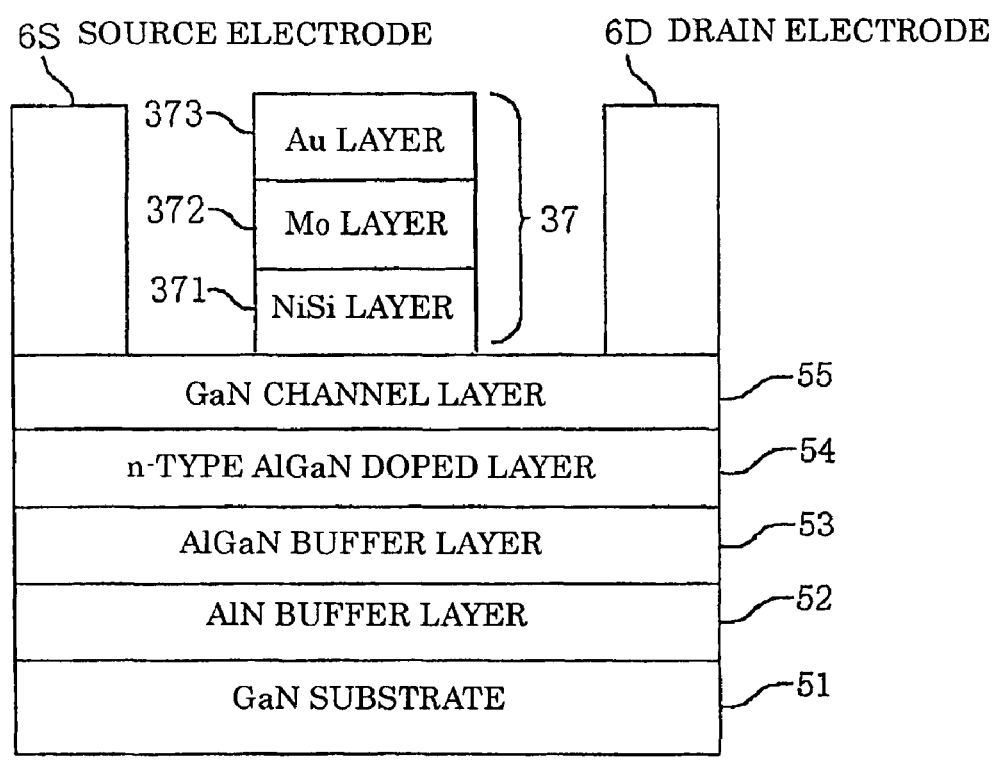
FIG. 15 is a local longitudinal sectional view showing the main structure of the AlGaN/GaN heterojunction field-effect transistor in a ninth embodiment according to the present invention.

Next, a ninth embodiment according to the present invention is described in reference to FIG. 15.

FIG. 15 is a local longitudinal sectional view showing the main structure of a GaN/AlGaN heterojunction field-effect transistor (HJFET) in the ninth embodiment according to the present invention. This embodiment according to the present invention has the same structure the GaN/AlGaN heterojunction field-effect transistor (HJFET) in the seventh embodiment, except that the gate electrode 57 in the seventh embodiment shown in FIG. 13 is replaced with the gate electrode 17 in the second embodiment in FIG. 5. Therefore, the detailed description of the forgoing effects brought about by the gate electrode structure 37 in the third embodiment shown in FIG. 9 also applies to the embodiment herein, and thereby, repetitive explanations are omitted. In addition, the description of other metal materials which can replace those in the gate electrode structure 37 applies to the embodiment herein, and thereby, repetitive explanations are omitted.

As stated above, according to the present invention, the Schottky junction electrode comprises a three-layer laminated structure wherein a first metal layer comprises any of Ni, Pt and Pd, a second metal layer comprises any of Mo, Pt, W, Ti, Ta, $Mo_xSi_{1-x}$, $Pt_xSi_{1-x}$, $W_xSi_{1-x}$, $Ti_xSi_{1-x}$, $Ta_xSi_{1-x}$, $Mo_xN_{1-x}$, $W_xN_{1-x}$, $Ti_xN_{1-x}$, and $Ta_xN_{1-x}$ (where, 0<x<1), and a third metal layer comprises any of Au, Cu, Al and Pt. Therefore, interdiffusion between the first metal layer and the third metal layer is suppressed, and the reliability of the device is enhanced. In addition, since the first metal layer has a high work function, the Schottky barrier is high, and superior Schottky contact is obtained. Furthermore, if the Schottky junction electrode comprises a two-layer laminated structure wherein the first metal layer comprises any of $Ni_ySi_{1-y}$, $Pt_ySi_{1-y}$, $Pd_ySi_{1-y}$, $Ni_yN_{1-y}$, and $Pd_yN_{1-y}$ (where, 0<y<1) and the second metal layer comprises any of Au, Cu, Al and Pt, the thermal diffusion of the first metal layer to the GaN semiconductor is suppressed, and the reliability of the device is enhanced. As a result, the composition contributes immensely to the high temperature characteristics and high power performance of the semiconductor device.

Although the present invention is described in relation to some of the preferred forms and embodiments, it can be understood that these forms and embodiments serve merely as examples provided to describe the invention, and they are not intended to limit the present invention to these forms and embodiments. Although it is obvious that a person skilled in the art can easily conduct several modifications and replacements by an equivalent component or technology after reading through this specification of the present invention, it is clear that these modifications and replacements fall under the veritable scope and spirit of the claims attached hereto.

INDUSTRIAL APPLICABILITY

As clarified by the foregoing description, although the improved Schottky junction structure according to the present invention can be applied to any GaN compound semiconductor device having a Schottky junction, it is preferable that the structure is applied, among others, to a high output semiconductor device which will be used in a microwave band, and in particular, to a semiconductor device which requires high heat resistance and excellent power performance.

What is claimed is:

1. A semiconductor device comprising a semiconductor layer which comprises a Group III–V compound semiconductor using $Ga_vAl_{1-v}$ (where, $0 \leq v \leq 1$) as a main component of the Group III-elements and N as a main component of the Group V-elements and a Schottky junction metal layer which is in contact with the semiconductor layer, wherein:
said Schottky junction metal layer comprises a laminated structure wherein a first metal layer is in contact with said semiconductor layer, a second metal layer is in contact with said first metal layer, and a third layer is in contact with said second layer;
said second metal layer comprises a metal material having a higher melting point than those of the metal materials in said first metal layer and said third metal layer;
said third metal layer comprises a metal material having a lower resistivity than those of the metal materials in said first metal layer and said second metal layer;
said first metal layer comprises any metal material selected from a group comprising $Ni_zN_{1-z}$, and $Pd_zN_{1-z}$, (where, 0<z<1); and
said second metal layer comprises any metal material selected from a group comprising Mo, W, Ta, $Mo_xSi_{1-x}$, $Pt_xSi_{1-x}$, $W_xSi_{1-x}$, $Ti_xSi_{1-x}$, $Ta_xSi_{1-x}$, $Mo_xN_{1-x}$, $W_xN_{1-x}$, $Ti_xN_{1-x}$, and $Ta_xN_{1-x}$, (where, 0<x<1).

2. The semiconductor device according to claim 1, wherein said third metal layer comprises any metal material selected from a group comprising Au, Cu, Al, and Pt.

3. The semiconductor device according to claim 1, wherein said first metal material comprises a metal material having a higher work function than that of the metal material in said second metal material.

4. The semiconductor device according to claim 3, wherein said metal layer comprises a metal material having a higher work function than that of the metal material in said third metal layer.

5. The semiconductor device according to claim 1, wherein the melting point of said second metal layer is 1,000° C. or higher.

6. The semiconductor device according to claim 1, wherein said semiconductor layer is formed on a multilayered structure comprising a plurality of compound semiconductor layers formed on a substrate.

7. The semiconductor device according to claim 6, wherein said substrate comprises any substrate selected from a group comprising a sapphire substrate, a SiC substrate, and a GaN substrate.

8. The semiconductor device according to claim 1, wherein said semiconductor layer is an $Al_uGa_{1-u}N$ layer (where, $0 \leq u \leq 1$).

9. The semiconductor device according to claim 1, wherein said semiconductor layer is a GaN compound semiconductor electron supplying layer formed on a GaN compound semiconductor channel layer.

10. The semiconductor device according to claim 9, whereinsaid GaN compound semiconductor channel layer comprises a compound semiconductor selected from a group comprising GaN and InGaN, and a GaN compound semiconductor electron supplying layer comprises AlGaN.

11. The semiconductor device according to claim 1, wherein said semiconductor layer is a GaN compound semiconductor channel layer formed on a GaN compound semiconductor electron supplying layer.

12. The semiconductor device according to claim 11, wherein said GaN compound semiconductor channel layer comprises a compound semiconductor selected from a group comprising GaN and InGaN, and said GaN compound semiconductor electron supplying layer comprises AlGaN.

13. The semiconductor device according to claim 1, wherein said semiconductor layer is a n-type GaN channel layer.

14. A semiconductor device comprising a semiconductor layer which comprises a Group III–V compound semiconductor using $Ga_vAl_{1-v}$ (where, $0 \leq v \leq 1$) as a main component of the Group III-elements and N as a main component of the Group V-elements and a Schottky junction metal layer which is in contact with the semiconductor layer, wherein:
said Schottky junction metal layer comprises a laminated structure wherein a first metal layer is in contact with said semiconductor layer, a second metal layer is in contact with said first metal layer, and a third layer is in contact with said second layer;
said second metal layer comprises a metal material having a higher melting point than those of the metal materials in said first metal layer and said third metal layer;
said third metal layer comprises a metal material having a lower resistivity than those of the metal materials in said first metal layer and said second metal layer;

said first metal layer comprises any metal material selected from a group comprising $Ni_{z4}N_{1-z4}$ (where, $0.5 \leq z4 \leq 0.85$), and $Pd_{z5}N_{1-z5}$ (where, $0.5 \leq z5 \leq 0.85$); and said second metal layer comprises any metal material selected from a group comprising Mo, W, Ta, $Mo_xSi_{1-x}$, $Pt_xSi_{1-x}$, $W_xSi_{1-x}$, $Ti_xSi_{1-x}$, $Ta_xSi_{1-x}$, $Mo_xN_{1-x}$, $W_xN_{1-x}$, $Ti_xN_{1-x}$, and $Ta_xN_{1-x}$, (where, $0<x<1$).

15. The semiconductor device according to claim 14, wherein said third metal layer comprises any metal material selected from a group comprising Au, Cu, Al, and Pt.

16. The semiconductor device according to claim 14, wherein said first metal layer comprises a metal material having a higher work function than that of the metal material in said second metal layer.

17. The semiconductor device according to claim 16, wherein said first metal layer comprises a metal material having a higher work function than that of the metal material in said third metal layer.

18. The semiconductor device according to claim 14, wherein the melting point of said second metal layer is 1,000° C. or higher.

19. The semiconductor device according to claim 14, wherein said semiconductor layer is formed on a multilayered structure comprising a plurality of compound semiconductor layers formed on a substrate.

20. The semiconductor device according to claim 19, wherein said substrate comprises any substrate selected from a group comprising a sapphire substrate, a SiC substrate and a GaN substrate.

21. The semiconductor device according to claim 14, wherein said semiconductor layer is an $Al_uGa_{1-u}N$ layer (where, $0 \leq u \leq 1$).

22. The semiconductor device according to claim 14, wherein said semiconductor layer is a GaN compound semiconductor electron supplying layer formed on a GaN compound semiconductor channel layer.

23. The semiconductor device according to claim 22, wherein said GaN compound semiconductor channel layer comprises a compound semiconductor selected from a group comprising GaN and InGaN, and GaN compound semiconductor electron supplying layer comprises AlGaN.

24. The semiconductor device according to claim 14, wherein said semiconductor layer is a GaN compound semiconductor channel layer formed on a GaN compound semiconductor electron supplying layer.

25. The semiconductor device according to claim 24, wherein said GaN compound semiconductor channel layer comprises a compound semiconductor selected from a group comprising GaN and InGaN, and said GaN compound semiconductor electron supplying layer comprises AlGaN.

26. The semiconductor device according to claim 14, wherein said semiconductor layer is a n-type GaN channel layer.

27. A semiconductor device comprising a semiconductor layer comprising a Group III–V compound semiconductor using $Ga_vAl_{1-v}$ (where, $0 \leq v \leq 1$) as a main component of the Group III-elements and N as a main component of the Group V-elements and a Schottky junction metal layer which is in contact with the semiconductor layer, wherein:

said Schottky junction metal layer comprises a laminated structure wherein a first metal layer is in contact with said semiconductor layer and a second metal layer is in contact with said first metal layer;

said first metal layer comprises a metal material having a higher melting point than that of the metal material in said second metal layer;

said second metal layer comprises a metal material having a lower resistivity than that of the metal material in said first metal layer; and said first metal layer comprises any metal material selected from a group comprising $Ni_yN_{1-y}$ and $Pd_yN_{1-y}$ (where, $0<y<1$).

28. A semiconductor device comprising a semiconductor layer comprising a Group III–V compound semiconductor using $Ga_vAl_{1-v}$ (where, $0 \leq v \leq 1$) as a main component of the Group III-elements and N as a main component of the Group V-elements and a Schottky junction metal layer which is in contact with the semiconductor layer, wherein:

said Schottky junction metal layer comprises a laminated structure wherein a first metal layer is in contact with said semiconductor layer and a second metal layer is in contact with said first metal layer;

said first metal layer comprises a metal material having a higher melting point than that of the metal material in said second metal layer;

said second metal layer comprises a metal material having a lower resistivity than that of the metal material in said first metal layer; and said first metal layer comprises any metal material selected from a group comprising $Ni_yN_{1-y}$ and $Pd_yN_{1-y}$ (where, $0<y<1$).

wherein said second metal layer comprises any metal material selected from a group comprising any metal material selected from a group comprising Au, Cu, Al, and Pt.

29. The semiconductor device according to claim 27, wherein said first metal layer has a higher work function than said second metal layer.

30. The semiconductor device according to claim 27, wherein the melting point of said first metal layer is 1,000° C. or higher.

31. The semiconductor device according to claim 27, wherein said semiconductor layer is formed on a multilayered structure comprising a plurality of compound semiconductor layers formed on a substrate.

32. The semiconductor device according to claim 31, wherein said substrate comprises any substrate selected from a group a sapphire substrate, a SiC substrate, and a GaN substrate.

33. The semiconductor device according to claim 27, wherein said semiconductor layer is an $Al_uGa_{1-u}N$ layer (where, $0 \leq u \leq 1$).

34. The semiconductor device according to claim 27, wherein said semiconductor layer is a GaN compound semiconductor electron supplying layer formed on a GaN compound semiconductor channel layer.

35. The semiconductor device according to claim 34, wherein said GaN compound semiconductor channel layer comprises a compound semiconductor selected from a group comprising GaN and InGaN, and GaN compound semiconductor electron supplying layer comprises AlGaN.

36. A semiconductor device comprising a semiconductor layer comprising a Group III–V compound semiconductor using $Ga_vAl_{1-v}$ (where, $0 \leq v \leq 1$) as a main component of the Group III-elements and N as a main component of the Group V-elements and a Schottky junction metal layer which is in contact with the semiconductor layer, wherein:

said Schottky junction metal layer comprises a laminated structure wherein a first metal layer is in contact with said semiconductor layer and a second metal layer is in contact with said first metal layer;

said first metal layer comprises a metal material having a higher melting point than that of the metal material in said second metal layer;

said second metal layer comprises a metal material having a lower resistivity than that of the metal material in said first metal layer; and said first metal layer comprises any metal material selected from a group comprising $Ni_yN_{1-y}$ and $Pd_yN_{1-y}$ (where, $0<y<1$).

wherein said semiconductor layer is a GaN compound semiconductor channel layer formed on a GaN compound semiconductor electron supplying layer.

37. The semiconductor device according to claim 36, wherein said GaN compound semiconductor channel layer comprises a compound semiconductor selected from a group comprising GaN and InGaN, and said GaN compound semiconductor electron supplying layer comprises AlGaN.

38. A semiconductor device comprising a semiconductor layer comprising a Group III–V compound semiconductor using $Ga_vAl_{1-v}$ (where, $0 \leq v \leq 1$) as a main component of the Group III-elements and N as a main component of the Group V-elements and a Schottky junction metal layer which is in contact with the semiconductor layer, wherein:

said Schottky junction metal layer comprises a laminated structure wherein a first metal layer is in contact with said semiconductor layer and a second metal layer is in contact with said first metal layer;

said first metal layer comprises a metal material having a higher melting point than that of the metal material in said second metal layer;

said second metal layer comprises a metal material having a lower resistivity than that of the metal material in said first metal layer; and said first metal layer comprises any metal material selected from a group comprising $Ni_yN_{1-y}$ and $Pd_yN_{1-y}$ (where, $0<y<1$).

wherein said semiconductor layer is a n-type GaN channel layer.

39. A semiconductor device comprising a semiconductor layer which comprises a Group III–V compound semiconductor using $Ga_vAl_{1-v}$ (where, $0 \leq v \leq 1$) as a main component of the Group III-elements and N as a main component of the Group V-elements and a Schottky junction metal layer which is in contact with the semiconductor layer, wherein:

said Schottky junction metal layer comprises a laminated structure wherein a first metal layer is in contact with said semiconductor layer and a second metal layer is in contact with said first metal layer;

said first metal layer comprises a metal material having a higher melting point than that of the metal material in said second metal layer;

said second metal layer comprises a metal material having a lower resistivity than that of the metal material of said first metal layer; and said first metal layer comprises any metal material selected from a group comprising $Ni_{y4}N_{1-y4}$ and $Pd_{y5}N_{1-y5}$ (where, $0.5 \leq y5 \leq 0.85$ and $0.5 \leq y4 \leq 0.85$).

40. The semiconductor device according to claim 39, wherein said second metal layer comprises any metal material selected from a group comprising Au, Cu, Al, and Pt.

41. The semiconductor device according to claim 39, wherein said first metal layer has a higher work function than said second metal layer.

42. The semiconductor device according to claim 39, wherein the melting point of said first metal layer is 1,000° C. or higher.

43. The semiconductor device according to claim 39, wherein said semiconductor layer is formed on a multilayered structure comprising a plurality of compound semiconductor layers formed on a substrate.

44. The semiconductor device according to claim 43, wherein said substrate comprises any substrate selected from a group comprising a sapphire substrate, a SiC substrate, and a GaN substrate.

45. The semiconductor device according to claim 39, wherein said semiconductor layer is an $Al_uGa_{1-u}N$ layer (where, $0 \leq u \leq 1$).

46. The semiconductor device according to claim 39, wherein said semiconductor layer is a GaN compound semiconductor electron supplying layer formed on a GaN compound semiconductor channel layer.

47. The semiconductor device according to claim 46, wherein said GaN compound semiconductor channel layer comprises a compound semiconductor selected from a group comprising GaN and InGaN, and said GaN compound semiconductor electron supplying layer comprises AlGaN.

48. The semiconductor device according to claim 39, wherein said semiconductor layer is a GaN compound semiconductor channel layer formed on a GaN compound semiconductor electron supplying layer.

49. The semiconductor device according to claim 48, wherein said GaN semiconductor channel layer comprises a compound semiconductor selected from GaN and InGaN, and said GaN compound semiconductor electron supplying layer comprises AlGaN.

50. The semiconductor device according to claim 39, wherein said semiconductor layer is a n-type GaN channel layer.

* * * * *